United States Patent [19]

Bowmaster

[11] Patent Number: 5,455,832
[45] Date of Patent: Oct. 3, 1995

[54] METHOD AND SYSTEM FOR TESTING A SONET NETWORK ELEMENT

[75] Inventor: Thomas A. Bowmaster, Morris Township, Morris County, N.J.

[73] Assignee: Bell Communications Research, Inc., Livingston, N.J.

[21] Appl. No.: 169,890

[22] Filed: Dec. 17, 1993

[51] Int. Cl.$^6$ .................................................. G06F 11/00
[52] U.S. Cl. ............................................. 371/20.1
[58] Field of Search ................................ 371/20.1, 8.2, 371/61, 62; 395/575

[56] References Cited

U.S. PATENT DOCUMENTS

| | | | |
|---|---|---|---|
| 5,130,980 | 7/1992 | Kobayashi | 391/48 |
| 5,132,991 | 7/1992 | McNesby et al. | 375/116 |
| 5,251,204 | 11/1993 | Izawa et al. | 370/15 |
| 5,301,050 | 4/1994 | Czerwiec et al. | 395/110 |
| 5,365,510 | 11/1994 | Nicholson et al. | 370/16 |
| 5,369,653 | 11/1994 | Kuroda | 371/67.1 |

OTHER PUBLICATIONS

Grover "Effect of Error Correcting Code Using DS–3 Framing Bits on Measured Dribble–Error Pattern of 565 Mbits/s Fibre Optic Transmission System" Electronics Letters 24th Sep. 1992, vol. 28, No: 20 pp. 1869–1871.

Nagara; et al "Improvements in Availability an Error Performance of SONET Compared to Asynchronous Transport System" Communications, 1990 IEEE Int. Conf. pp. 248–254.

Salloum et al "B—ISON User Network Interface: Implementation of Performance Monitoring Functions Using SONET Overhead" Communcations, 1990 IEEE Int. Conf. pp. 822≧825.

Grover et al. "Found Error Correction for the Synchronous Optical Network (SONET) Signal Standard" WESCANEX 1988 Digital Comm. Conf. pp. 88–93.

Robe et al "A SONET STS–3c User Network Interface 1C" IEEE 1991 Custom Integrated Circuits Conference pp.3.2.1–3.2.4.

"Synthronous Optical Network (SONET) Transport Systems: Common Generic Criteria", Technical Reference TR–NWT–000253, Issue 2, Dec. 1991.

*Primary Examiner*—Robert W. Beausoliel, Jr.
*Assistant Examiner*—Joseph E. Palys
*Attorney, Agent, or Firm*—Leonard Charles Suchyta; James W. Falk

[57] ABSTRACT

Method and system are described for testing SONET network elements (NE) against various SONET logical layer criteria or standards. A "basic" signal is developed or generated to meet many of the criteria in order to minimize the number of alarms or abnormal conditions reported by the NE. Simple procedures are provided to modify the basic signal. The test signals are utilized to test a network element's ability to detect and respond to incoming signal failures and maintenance signals, its payload mappings, and its use of various overload bits and bytes.

14 Claims, 14 Drawing Sheets

| VT1.5 | VT2 | VT3 | VT6 |
|---|---|---|---|
| V1 | V1 | V1 | V1 |
| 78 | 105 | 159 | 321 |
| ⋮ | ⋮ | ⋮ | ⋮ |
| 103 | 139 | 211 | 427 |
| V2 | V2 | V2 | V2 |
| 0 | 0 | 0 | 0 ← ZERO POINTER OFFSET |
| ⋮ | ⋮ | ⋮ | ⋮ |
| 25 | 34 | 52 | 106 |
| V3 | V3 | V3 | V3 ← NEGATIVE STUFF OPPORTUNITY |
| 26 | 35 | 53 | 107 ← POSITIVE STUFF OPPORTUNITY |
| ⋮ | ⋮ | ⋮ | ⋮ |
| 51 | 69 | 105 | 213 |
| V4 | V4 | V4 | V4 |
| 52 | 70 | 106 | 214 |
| ⋮ | ⋮ | ⋮ | ⋮ |
| 77 | 104 | 158 | 320 |

DESIGNATIONS:
V1 VT POINTER 1
V2 VT POINTER 2
V3 VT POINTER 3 (ACTION)
V4 VT RESERVED

*Fig. 10*

| Contents of SONET Signal (byte values in hex) | | | | DS1 output from NE with 1 superframe delay in using NDF | DS1 output from NE with no delay in using NDF |
|---|---|---|---|---|---|
| | V1=6C CC . . . | R=00 CC . . . | S=80 CC . . . | 193 bits of 1100 pattern | 193 bits of 1100 pattern |
| | V2=00 → 99 . . . | V5=00 99 . . . | S=02 99 . . . | 193 bits of 1100 pattern | 193 bits of 1100 pattern |
| | V3=00 33 . . . | R=00 33 . . . | S=82 33 . . . | 193 bits of 1100 pattern | 193 bits of 1100 pattern |
| | V4=00 66 . . . | R=00 66 . . . | S=80 66 . . . | 193 bits of 1100 pattern | 193 bits of 1100 pattern |
| | V₁=9C CC . . . | R=00 CC . . . | S=80 CC . . . | 193 bits of 1100 pattern | 193 bits of 1100 pattern |
| | V2=04 X=FF S=02 CC . | X=FF X=FF CC . | X=FF V5=00 CC . | 17 1s<br>1 00 byte<br>1 02 byte<br>160 bits of 1100 pat. | 0 to 32 bits of unspecified output and 161 bits of 1100 pat. |
| | V3=00 CC S=82 99 . | CC CC 99 99 . | CC R=00 99 99 . | 17 bits of 1100 pat.<br>1 00 byte<br>1 82 byte<br>160 bits of 1100 pat. | 193 bits of 1100 pattern |
| | V4=00 99 S=82 33 . | 99 99 33 33 . | 99 R=00 33 33 . | 17 bits of 1100 pat.<br>1 00 byte<br>1 82 byte<br>160 bits of 1100 pat. | 193 bits of 1100 pattern |
| | V1=6C 33 S=80 66 . | 33 33 66 66 . | 33 R=00 66 66 . | 17 bits of 1100 pat.<br>1 00 byte<br>1 80 byte<br>160 bits of 1100 pat. | 193 bits of 1100 pattern |
| | V2=04 → 66 S=00 CC . | 66 66 CC CC . | 66 V5=00 CC CC . | 0 to 32 bits of unspecified output and 161 bits of 1100 pat. | 193 bits of 1100 pattern |

 Section and Line Overhead bytes

 STS-1s and VTs not involved in the test

 Pointer offset indicator

R = Reserved bytes

S = Bytes following V5 and R bytes in DS1 mapping. Contains 1 DS1 information bit (in bit 7) and 7 overhead bits.

X = Bytes between old offset and new offset

. . = Same values as the previous byte in that column.<br>. = Total of 9 rows per frame.

Fig. 17

METHOD AND SYSTEM FOR TESTING A SONET NETWORK ELEMENT

TECHNICAL FIELD

This invention relates to testing methods and systems and, in particular, to testing methods and systems for SONET network elements.

BACKGROUND ART

A synchronous optical network (SONET) is well known in the art and includes network elements (NEs) such as Add-Drop Multiplexers (ADM's). With respect to operations data networking, the SONET NEs are either Gateway NEs, Intermediate NEs, or End NEs as illustrated in FIG. 1.

SONET signals have rates and formats as defined in BELLCORE TECHNICAL REFERENCE entitled "Synchronous Optical Network (SONET) Transport Systems: Common Generic Criteria", TR-NWT-00253 (TR 253), which contains many criteria that are applicable to SONET NEs. This is realized by defining a basic signal of 51.840 Mb/s and a byte interleaved multiplex scheme. The basic signal can be divided into a portion assigned to overhead and a portion that carries the payload. Payload pointers are mechanisms that allow the payload to shift relative to the overhead, thus permitting the accommodation of different signal phases and frame rates in multiplexing.

The Synchronous Transport Signal-level 1 (STS1) is the basic modular signal. Its rate is 51.840 Mb/s. The optical counterpart of the STS-1 is the Optical Carrier-level 1 signal (OC-1), which is the result of a direct optical conversion of the STS-1 h after frame synchronous scrambling.

The definitions of the first levels (STS-1 and OC-1) define the entire hierarchy of synchronous optical signals because the higher level signals are obtained by synchronously multiplexing lower level signals. The higher level signals are denoted by STS—N and OC—N, where N is an integer. There is an integer multiple relationship between the rates of the basic module OC-1 and the multiplexed signal OC—N (i.e., the rate of OC—N is equal to N times the rate of OC-1).

SONET optical transmission systems support only certain values of N. Currently, these values are 1, 3, 12, 24 and 48. Table I lists standard optical carrier rates from 51.840 Mb/s up through 2488.320 Mb/s.

TABLE I

| Line Rates for The Allowable OC-N Signals | |
|---|---|
| OC Level | Line Rate (Mb/s) |
| OC-1 | 51.840 |
| OC-3 | 155.520 |
| OC-12 | 622.080 |
| OC-24 | 1244.160 |
| OC-48 | 2488.320 |

The SONET transport format presented here is based on ANSI T1.105. FIG. 2 depicts the STS-1 synchronous payload envelope (SPE). The STS—N signal is formed by byte innerleaving N STS-1 signals. The Virtual Tributary (VT) structure is designed for transport and switching of sub-STS-1 payloads. There are four sizes of VTx: VT 1.5 (1.728 Mb/s), VT2 (2.304 Mb/s), VT3 (3.456 Mb/s), and VT6 (6.912 Mb/s). In the 9-row structure of the STS-1 SPE, these VTs occupy 3 columns, 4 columns, 6 columns, and 12 columns, respectively.

The overhead and transport functions are broken into layers that increase in complexity from the viewpoints of hardware and the optical interface frame format. The layers are Physical, Section, Line and Path, as illustrated in FIGS. 3 and 4. The layers have a hierarchical relationship and are considered from the top down. The top-down approach provides a general introduction to the individual layers and their functionalities.

Each layer requires the services of all lower level layers to perform its function as illustrated in FIG. 4. For example, suppose that two Path layer processes are exchanging DS3s. The DS3 signal and STS POH are mapped into an STS-1 SPE, which is then given to the Line layer. The Line layer multiplexes several inputs from the Path layer (frame and frequency aligning each one) and adds Line overhead (e.g. overhead required for protection switching). Finally, the Section layer provides framing and scrambling before optical transmission by the Physical layer.

SONET Interface Layers

This section describes each layer in detail. Each description includes a broad classification of the layer, followed by a specification of the main functions it provides. Finally, examples of system hardware associated with the layer are given to clarify the role it plays. FIG. 4 depicts the relationship of the layers to each other.

Physical Layer

The physical layer deals with the transport of bits as optical or electrical pulses across the physical medium. No overhead is associated with the physical layer.

Section Layer

The section layer deals with the transport of an STS—N frame across the physical medium. This layer uses the physical layer for transport.

Functions of this layer include framing, scrambling, section error monitoring, and communicating section level overhead (such as Local Orderwire (LOW)). The overhead defined for this layer is interpreted and modified or created by Section Terminating Equipment (STE).

The section and physical layers can be used in some equipment (e.g. the STE regenerator) without involving the higher layers.

Line Layer

The line layer deals with the transport of STS SPE path layer payload and its overhead across the physical medium. All lower layers exist to provide transport for this layer.

This layer provides synchronization and multiplexing functions for the path layer. The overhead associated with these functions includes overhead for maintenance and protection purposes and is inserted into the line overhead channels. The line overhead for this layer is interpreted and modified or created by Line Terminating Equipment (LTE). Because the LTE contains section layer functions, it is also an STE.

An example of system equipment that communicates at this level is an OC—N to OC—M multiplex.

Path Layer

The path layer deals with the transport of network services between SONET terminal multiplexing equipment. Examples of such services are DS1s and DS3s.

The path layer maps the services into the format required by the line layer. In addition, this layer communicates end-to-end via the POH. The overhead defined for this layer is interpreted and modified or created by Path Terminating Equipment (PTE). Because the PTE contains line and section layer functions, it is also considered an LTE and STE.

An example of system equipment that communicates at this level is DS3 to STS-1 mapping circuits.

Interaction of the Layers

FIG. 4 depicts the interaction of the optical interface layers. Each layer

- communicates horizontally to peer equipment in that layer;
- processes certain information and passes it vertically to the adjacent layers.

The interactions are described in terms of each level's horizontal and vertical transactions.

FIG. 4 also shows network services as inputs to the path layer. This layer transmits horizontally to its peer entities the services and the POH. The path layer maps the services and POH into SPEs that it passes vertically to the line layer.

The line layer transmits to its peer entities SPEs and the line layer overhead. It maps the SPEs and line overhead into STS—N frames. SPEs are synchronized and multiplexed at this time and then the STS—N signal is passed to the section layer.

The section layer transmits to its peer entities STS—N signals with section layer overhead (e.g. LOW). It maps STS—N and the section overhead into bits that are handed to the physical layer, which transmits optical or electrical pulses to its peer entities.

Access to all four layers is not required of every SONET NE. For example, an STE regenerator would use only the first two layers (physical and section). Also, an NE that merely routes SPEs and does not accept any new inputs from the path layer only uses the first three layers (physical, section and line). However, these NEs may monitor the overhead of layers that they do not terminate.

STS-1 Payload Pointers

The STS-1 Payload Pointer provides a method of allowing flexible and dynamic alignment of the STS SPE within the STS Envelope Capacity, independent of the actual contents of the envelope.

Dynamic alignment means that the STS SPE is allowed to float within the STS Envelope Capacity. Thus, the pointer is able to accommodate differences not only in the phases of the STS SPE and the Transport Overhead, but in the frame rates as well.

Pointer Value

The Payload Pointer contained in H1 and H2 of the Line Overhead designates the location of the byte where the STS SPE begins. The two bytes allocated to the pointer function can be viewed as one word, as FIG. 5 shows. Bits 7 through 16 of the pointer word carry the pointer value. Bits 5 and 6 of the pointer word are set to zero except when transmitting STS Path AIS.

As FIG. 6 illustrates, the pointer value is a binary number with a range of 0 to 782, which indicates the offset between the pointer and the first byte of the STS SPE. The Transport Overhead bytes are not counted in the offset. For example, a pointer value of 0 indicates that the STS SPE starts in the byte location that immediately follows the H3 byte (pointer action byte), whereas an offset of 87 indicates that the STS SPE starts immediately after the K2 byte.

Frequency Justification

When there is a frequency offset between the frame rate of the Transport Overhead and that of the STS SPE, then the pointer value is incremented or decremented as needed, accompanied by a corresponding positive or negative stuff byte.

When the frame rate of the STS SPE is less than that of the Transport Overhead, the alignment of the envelope periodically slips back in time and the pointer is incremented by one. This operation is indicated by inverting bits 7, 9, 11, 13 and 15 (I-bits) of the pointer word. A positive stuff byte appears immediately after the H3 byte in the frame containing inverted I-bits. Subsequent pointers contain the new offset. FIG. 7 illustrates the positive pointer justification.

When the frame rate of the STS SPE is greater than that of the Transport Overhead, the alignment of the envelope is periodically advanced in time and the pointer is decremented by one. This operation is indicated by inverting bits 8, 10, 12, 14 and 16 (D-bits) of the pointer word. The H3 byte becomes a negative "stuff" byte, i.e. carries an SPE byte in the frame containing inverted D-bits. Subsequent pointers contain the new offset. FIG. 8 illustrates the negative pointer justification.

In the criteria of TR 253, it is an objective that the increment/decrement decision be made at the receiver by a match of 8 or more of the 10 I- and D-bits to either the increment or decrement indication. This method is an extension of the majority vote method for I- and D-bits separately and enhances performance during error bursts.

If an NE does not meet the "8 of 10" objective, it must make the increment decision based on a majority vote of I-bits, and the decrement decision based on a majority vote of D-bits.

New Data Flag (NDF).

Bits 1 through 4 (N-bits) of the pointer word carry an NDF, which allows an arbitrary change of the pointer value due to a change in the payload.

Normal operation is indicated by a "0110" code in the N-bits as illustrated in FIG. 5. The NDF is set by inverting the N-bits to "1001". The new alignment of the STS SPE is indicated by the pointer value accompanying the NDF and takes effect at the offset indicated.

The decoding at the receiver is performed by majority voting (i.e. the NDF is considered set if three or more N-bits match to "1001").

Concatenation Indicator

A concatenation indicator contained in the STS-1 payload pointer is used to show that the STS-1 is part of an STS—Nc.

The first STS-1 within an STS—Nc has a normal pointer word. All subsequent STS-1s within the group have their pointer values (bits 7 through 16) set to all ones, the NDF set to "1001", and the remaining bits set to zeros. This value of the pointer word does not indicate a valid offset, but is a concatenation indicator. When the pointer processors interpret this value, they perform the same operations as performed on the first STS-1 within the STS—Nc.

Pointer Generation

The STS-1 Pointer is generated according to the rules listed below.

1. During normal operation, the pointer locates the start of the STS SPE within the STS Envelope Capacity. The NDF has the normal value "0110".

2. The pointer value can only be changed by operations 4, 5 or 6.

3. If an STS—Nc envelope is being transmitted, a pointer is generated for the first STS-1 only. The Concatenation Indicator is generated in place of the other pointers. All operations indicated by the pointer in the first STS-1 apply to each STS-1 in the STS—Nc.

4. If a positive stuff is required, the current pointer value is sent with the I-bits inverted, and the subsequent positive stuff opportunity is filled with dummy information. Subsequent pointers contain the previous pointer value incremented by one. No subsequent increment or decrement operation is allowed for three frames following this operation.

5. If a negative stuff is required, the current pointer value is sent with the D-bits inverted, and the subsequent negative stuff opportunity is overwritten with an SPE byte. Subsequent pointers contain the previous pointer value decremented by one. No subsequent increment or decrement operation is allowed for three frames following this operation.

6. If the alignment of the envelope changes for any reason other than rules 4 or 5, the new pointer value shall be sent accompanied by the NDF set to "1001". The set NDF only appears in the first frame that contains the new value. The new envelope begins at the first occurrence of the offset indicated by the new pointer. No subsequent increment or decrement operation is allowed for three frames following this operation.

Pointer Interpretation

The STS-1 pointer is interpreted according to the rules listed below.

1. During normal operation, the pointer locates the start of the STS SPE within the STS Envelope Capacity.

2. Any variation from the current pointer value is ignored unless a consistent new value is received three times consecutively or it is preceded by rule 4, 5 or 6. Any consistent new value received three times in succession overrides (i.e., takes priority over) rules 4, 5 or 6.

3. If the pointer word contains the Concatenation Indicator, then the operations performed on the STS-1 are identical to those performed on the first STS-1 within the STS—Nc. Rules 4 and 5 do not apply to this pointer word.

4. If a positive stuff operation is indicated, the current pointer value shall be incremented by one.

5. If a negative stuff operation is indicated, the current pointer value shall be decremented by one.

6. If NDF set is indicated, then the coincident pointer value shall replace the current one at the offset indicated by the new pointer value.

VT Payload Pointers

The VT Payload Pointer provides a method of allowing flexible and dynamic alignment of the VT SPE within the VT Superframe, independent of the actual contents of the envelope.

VT Pointer Value

The V1 and V2 bytes allocated to the VT pointer can be viewed as one word, as FIG. 9 shows.

The pointer value (bits 7 through 16) is a binary number that indicates the offset from V2 to the first byte of the VT SPE. The range of the offset is different for each of the VT sizes, as FIG. 10 illustrates. The pointer bytes are not counted in the offset calculation.

Frequency Justification

The VT Payload Pointer is used to frequency justify the VT SPE to the STS SPE rate in exactly the same way that the STS-1 Payload Pointer is used to frequency justify the STS SPE to the frame rate of the Transport Overhead. A positive stuff opportunity immediately follows the V3 byte. V3 serves as the negative stuff opportunity, such that when the opportunity is taken, the V3 byte is overwritten by an SPE byte. This is illustrated in FIG. 10. The indication of whether or not a stuff opportunity has been taken is provided by the I- and D-bits of the pointer in the same VT Superframe. The value contained in V3 when not being used for a negative stuff is undefined.

VT Size Indicator

Bits 5 and 6 of the VT Payload Pointer indicate the size (x) of the VTx. Four sizes are defined along with their corresponding VT pointer range, as Table II shows.

TABLE II

| | VT Size Indicator | |
|---|---|---|
| Size | Designation | VT Pointer Range |
| 00 | VT6 | 0-427 |
| 01 | VT3 | 0-211 |
| 10 | VT2 | 0-139 |
| 11 | VT1.5 | 0-103 |

New Data Flag (NDF)

Bits 1 through 4 (N-bits) of the pointer word carry an NDF. It allows an arbitrary change of the value of a pointer, or the size of the VT, due to a change in the payload. If there is a change in VT size, then, implicitly, there is a simultaneous new data transition in all of the VTs in the VT group.

Normal operation is indicated by "0110" in the N-bits. NDF shall be set to "1001" to indicate a new alignment for the envelope, or a new size. If a new size is indicated, then all VT pointers (1 to 4) in the VT group shall simultaneously indicated NDF with the same new size. The new alignment, and possibly size, is indicated by the pointer value and size indicator accompanying the NDF and takes effect at the offset indicated.

The decoding at the receiver is performed by majority voting (i.e., the NDF is considered set if three or more N-bits match "1001").

VT Concatenation

Sub-STS-1 services that require N times VTx rates can be transported by concatenated VTx—NCs whose constituent VTxs are kept together in a way to ensure phases and sequence integrity.

As with the STS-1 Payload Pointer the VT Payload Pointer uses the Concatenation Indicator (all ones in bits 7 through 16, the NDF set to "1001", and VT sizes to "00") to indicate that the VTxs are concatenated. This function is only defined for VT6s in the formation of VT6—Ncs. If a pointer contains the Concatenation Indicator, it is an indication to the pointer processor that this VTx is concatenated to the previous VTx, and all operations indicated by the previous pointer are to be performed on this VTx as well.

VT Pointer Generation and Interpretation

Generation and interpretation of the VT Payload Pointer for VT SPE follows the rules provided for the STS-1 Payload Pointer, with the following modifications:

1. The terms "STS" and "frame" are replaced with "VT" and "superframe", respectively.

2. Additional pointer generation rule 7: If the size of the VTs within a VT group is to change, then an NDF, as described in rule 6, shall be sent in all VTs of the new size in the group simultaneously.

3. Additional pointer interpretation rule 7: if a set NDF and an arbitrary new size of VT are received simultaneously in all of the VTs within a VT group, then the coincident pointers and sizes shall replace the current values immediately.

Performance Monitoring

Performance Monitoring (PM) is required according to the level of functionality provided in the NE. SONET provides the capability of gathering PM data based on overhead bits, such as Bit Interleaved Parity—N (BIP—N) bits, at the Section, Line and Path layers. For those SONET NEs that interface to the existing digital network (e.g., DS1), certain DSn PM parameters may also be required.

PM refers to the in-service monitoring of transmission quality. The three key components of PM are:

1. Detection of transmission degradation;
2. Derivation of useful performance parameters from the detected degradation; and
3. Communication of these parameters to a surveillance OS.

Performance parameters to be monitored are described herein. Thresholds on these parameters are used to detect transmission degradation. Threshold Crossing Alerts (TCAs) are used to notify a surveillance OS of a degradation. The OS may also query the NE for performance information stored in the NE.

BELLCORE TECHNICAL REFERENCE NO. TR-TSY-000820 specifies PM strategies and a general set of PM parameters. SONET requires modification of some existing parameters and the definition of some new parameters. The following sections describe the PM parameters for each SONET layer, and identify the storage requirements for SONET NEs. At certain SONET layers (e.g., STS and VT paths), both near end and far end performance can be monitored. Where far end performance can also be monitored, appropriate performance parameters, storage and thresholding requirements are provided.

Section layer performance parameters available in SONET are:

1. Severely Errored Framing Second (SEFS)—This parameter counts occurrences of an OOF detected by an on-line framer, or occurrences of an off-line framer changing frame alignment to a new frame position In measuring SEFSs, a 1-second integration period is allowed so that one or more OOF/COFAs (Change-of-Frame-Alignments) occurring within a 1-second interval count as one SEFS event.

2. Section Coding Violations (CVs)—Section CVs are BIP errors that are detected at the Section layer of the incoming SONET signal. The Section CV counter is incremented for each BIP error detected. That is, each BIP-8 can detect up to 8 errors per STS—N frame, with each error incrementing the CV counter. CVs for the Section layer are collected using the BIP-8 in the B1 byte located in the Section overhead of STS-1 number 1.

3. Section Errored Seconds (ESs)—A Section ES is a second during which at least one Section CV or OOF/COFA event occurred, or a second during which the NE was (at any point during the second) in the LOS state.

Section Severely Errored Seconds (SESs)—A Section SES is a second with K or more Section CVs, or a second during which at least one OOF/COFA event occurred, or a second during which the NE was (at any point during the second) in the LOS state. The number of Section CVs within a second that constitutes a Section SES is settable. Table III defines the default values for K for the different OC—N rates. At an OC-1 rate, this definition of a Section SES corresponds to a $1.5 \times 10^{-7}$ BER. At an OC-3 rate an above, this definition of a Section SES corresponds to a $10^{-7}$ BER.

TABLE III

| Section SESs | |
|---|---|
| Rate | CVs |
| OC-1 | 9 |
| OC-3 | 16 |
| OC-12 | 63 |
| OC-24 | 125 |
| OC-48 | 249 |

There are no far end performance parameters defined for the Section layer.

The Line layer performance parameter available for SONET are:

1. Line CVs—Line CVs are the sum of the BIP errors detected at the Line layer of the incoming SONET signal. The Line CV counter is incremented for each BIP error detected. That is, each line BIP-8 can detect up to eight errors per STS-1 frame, with each error incrementing the CV counter. CVs for the Line layer are collected using the BIP-8 codes in B2 bytes located in the Line overhead of each STS-1 (because all CVs on an STS—N line are counted together, this is equivalent to counting each error in the BIP-8N contained in the B2 bytes of the STS—N line overhead). Thus, on an STS—N signal, up to 8×N CVs may occur in a frame.

2. Line ESs—A Line ES is a second during which at least one Line CV occurred, or a second during which the line was (at any point during the second) in the Line AIS state.

3. Line SESs—A Line SES is a second with K or more line CVs or a second during which the line was (at any point during the second) in the Line AIS state. The number of Line CVs within a second that constitutes an SES is settable. Table IV defines the default values for K for the different SONET line rates. These definitions of Line SES correspond to a $2 \times 10^{-7}$ BER.

TABLE IV

| Line SESs | |
|---|---|
| Rate | CVs |
| OC-1 | 12 |
| OC-3 | 32 |
| OC-12 | 124 |
| OC-24 | 248 |
| OC-48 | 494 |

4. STS Pointer Justifications (PJs)—The STS PJ parameter is a count of the differences between incoming pointer justifications detected by an NE on an STS SPE that is not terminated, and the outgoing pointer justifications performed by the NE on the same STS SPE. A certain number of pointer justifications are expected during normal operations, but excessive pointer justification may indicate a synchronization problem.

5. Protection Switching Counts (PSCs)—This parameter applies to each working and protection line. This parameter counts the number of times that service on a monitored line has been switched to the protection line and from the protection line.

6. Protection Switching Duration (PSD)—This parameter applies to each working and protection line. This parameter counts the number of seconds that service was switched from the line being monitored to the protection line. It does not apply to NEs using non-revertive protection switching.

The near end (or incoming) STS Path layer performance parameters available in SONET are:

1. STS Path CVs—STS Path CVs are BIP errors that are detected at the STS Path layer of the incoming SONET signal. As with Line and Section CVs, the STS Path CV counter is incremented for each BIP error detected. CVs for the STS Path layer are collected using the BIP-8 in the B3 byte located in the STS Path Overhead.

2. STS Path ESs—An STS Path ES is a second during which at least one STS Path CV occurred, or a second during which the NE was (at any point during the second) in the STS path AIS state or STS Path LOP state.

3. STS Path SESs—An STS Path SES is a second with K or more STS Path CVs, or a second during which the NE was (at any point during the second) in the STS Path AIS state or the STS Path LOP state. The number of STS Path CVs within a second that constitute an SES is settable. Table V specifies the default values for K for the STS-1 and STS-3c SPE. The specified values correspond to a $1.5 \times 10^{-7}$ BER for the STS-1 SPE and a $10^{-7}$ BER for the STS-3c SPE.

TABLE V

| STS Path SESs | |
|---|---|
| Rate | CVs |
| STS-1 | 9 |
| STS-3c | 16 |

4. STS Path Unavailable Seconds (UASs)—This parameter is a measure of duration in seconds for which the STS Path is considered unavailable. FIG. 11 describes the process for determining the beginning of unavailable time for an incoming STS Path using STS path SESs and declared failure indications. FIG. 12 describes the process for determining the end of unavailable time for an incoming STS Path. The failure conditions referred to in these figures are STS Path AIS and STS Path LOP.

5. VT PJs—The VT PJ parameter is a count of the differences between incoming pointer justifications detected by an NE on a VT SPE that is not terminated, and the outgoing pointer justifications performed by the NE on the same VT SPE. A certain number of PJs are expected during normal operations, but excessive pointer justification may indicate a synchronization problem.

Far end performance parameters are also defined for the STS Path layer. Far end STS Path layer performance is conveyed back to the near end STS PTE via the Path Status (G1) byte. Bits 1 through 4 provide an STS Path Far End Block Error (FEBE) indication and convey the number of BIP errors detected at the far end using the STS Path BIP-8 code in the B3 byte. Bit 5 of G1 is an STS Path Yellow indicator. Bits 6, 7 and 8 of the G1 byte are currently unassigned.

Implementations of an STS Path FERF function are currently under study in Committee T1. When finalized, it is expected that modifications will be made to include requirements related to such a function. One area for which an STS Path FERF function would have significant impact is the definition and operation of far end STS Path performance parameters. The availability of an STS Path FERF function would allow near end and far end counts of PM parameters to be more closely aligned. Until progress is made in standards for the STS Path FERF function, the following definitions apply for far end STS Path performance parameters:

1. Far End STS Path CVs—Far End STS Path CVs are BIP errors detected at the STS Path layer of the incoming signal at the far end. These CVs are collected using the STS Path FEBE indication in the incoming STS path Status (G1) byte. The Far End STS Path CV counter is incremented for each error indicated in the STS Path FEBE indication.

2. Far End STS Path ESs—A Far End STS Path ES is a second during which at least one Far End STS Path CV is counted.

3. Far End STS Path SESs—A Far End STS Path SES is a second during which K or more Far End STS Path CVs are counted. The number of Far End STS Path CVs within a second that constitute a Far End STS Path SES is settable. The value of K is identical to the corresponding value for near end STS Path SESs. Table V specifies the default values for K.

4. Far End STS path UASs—This parameter is a measure (at the near end) of the duration in seconds for which the STS Path is considered unavailable at the far end. FIG. 13 describes the process for determining the beginning of unavailable time for a far end STS Path using Far End STS Path SESs and STS Path Yellow signal. FIG. 14 describes the process for determining the end of unavailable time for a far end STS Path.

VT Path layer parameters in SONET exist only for floating VTs because they are derived from the V5 byte. The near end (or incoming) VT Path layer performance parameters available in SONET are:

1. VT Path CVs—VT Path CVs are BIP errors that are detected at the VT Path layer of the incoming SONET signal. CV counters are incremented for each BIP error detected. CVs for the VT Path layer are collected using the BIP-2 in the V5 overhead byte of the floating VT.

2. VT Path ESs—A VT Path ES is a second during which at least one VT Path CV occurred, or a second during which the NE was (at any point during the second) in the VT Path AIS state or VT Path LOP state.

3. VT Path SESs—A VT Path SES is a second with K or more VT Path CVs, or a second during which the NE was (at any point during the second) in the VT Path AIS state or VT Path LOP state. The number of VT Path CVs within a second that constitutes a VT Path SES is settable. Table VI defines the default values for K for the different size VTs. The specified default values correspond to a $2 \times 10^{-6}$ BER.

TABLE VI

| VT Path SESs | |
|---|---|
| Rate | CVs |
| VT1.5 | 4 |
| VT2 | 6 |

TABLE VI-continued

VT Path SESs

| Rate | CVs |
| --- | --- |
| VT3 | 8 |
| VT6 | 14 |

4. VT Path UASs—This parameter is a measure of duration in seconds for which the VT Path is considered unavailable. FIG. 11 describes the process for determining the beginning of unavailable time for an incoming VT Path using VT Path SESs and declared failure indications. FIG. 12 describes the process for determining the end of unavailable time for an incoming VT Path. The failure conditions referred to in these figures are VT Path AIS and VT Path LOP.

Far end performance parameters are also defined for the VT Path layer for floating VTs. Far end VT Path layer performance is conveyed back to the near end VT PTE via the V5 VT Path overhead byte. Bit 3 provides a VT Path layer FEBE indication and bit 8 provides a VT Path Yellow indicator. Bit 4 of the V5 byte is currently unassigned.

Implementations of a VT Path FERF function are currently under study in Committee T1. When finalized, it is expected that modifications will be made to include requirements related to such a function. One area for which a VT Path FERF function would have significant impact is the definition and operation of far end VT path performance parameters. The availability of a VT Path FERF function would allow near end and far end counts of PM parameters to be more consistent. Until progress is made in standards for the VT Path FERF function, the following definitions apply for far end VT Path performance parameters:

1. Far End VT Path CVs—Far End VT Path CVs are BIP errors detected at the VT Path layer of the incoming signal at the far end. These CVs are collected using the VT Path FEBE indication in the incoming V5 byte. The Far End VT Path CV counter is incremented for each error indicated in the VT Path FEBE indication.
2. Far End VT Path ESs—A Far End VT Path ES is a second during which at least one Far End VT Path CV is counted.
3. Far End VT Path SESs—A Far End VT Path SES is a second during which K or more Far End VT Path CVs are counted. The number of Far End VT Path CVs within a second that constitute a Far End VT Path SES is settable. The value of K is identical to the corresponding value for near end VT Path SESs. Table VI specifies the default values for K.
4. Far End VT Path UASs—This parameter is a measure (at the near end) of the duration in seconds for which the VT Path is considered unavailable at the far end. FIG. 13 describes the process for determining the beginning of unavailable time for a far end VT Path using Far End VT Path SESs and VT Path Yellow signal. FIG. 14 describes the process for determining the end of unavailable time for a far end VT Path.

The accumulation and storage of most performance parameters are inhibited during periods of unavailability for monitored entities where unavailable seconds is a defined parameter. Inhibiting a performance parameter during periods of unavailability is accomplished by not incrementing the current 15-minute and current-day registers by the value of the parameter for the second during which the monitored entity is considered unavailable (i.e. overwrite with zero for accumulation/storage purposes). Therefore, the only counts that should appear in the 15-minute and daily storage registers for a given parameter that is inhibited during periods of unavailability are counts for that parameter during times of availability of the monitored entity. UAS for a monitored entity (where it is defined) is never inhibited and it keeps track of unavailable time.

The accumulation and storage of CVs for a monitored entity is also inhibited in the same manner during certain periods of availability; that is for seconds during which the NE was (at any point during the second) in certain failure states for the monitored entity.

The rules for inhibiting performance parameters (including the far end parameters when activated) are summarized in the following requirements:

1. At the Section, Line, STS Path and VT Path layers, counts of near end CVs at the layer shall be inhibited during all seconds during which the monitored entity is (at any point during the second) in a LOS or LOF state. At the line, STS Path and VT Path layers, these counts shall also be inhibited during all seconds during which the monitored entity is in an AIS state. At the STS Path and VT Path layers, these counts shall also be inhibited during all seconds during which the monitored entity is in the LOP state. Far end Path CVs, as currently defined for the STS Path and VT Path layers, are not inhibited in the above manner since there is currently no mechanism available for the near end to know when the far end is experiencing Path AIS or Path LOP. Far end Path CVs are inhibited during unavailability of the path at the far end (see requirements below).
2. At the STS Path and VT Path layers, all near end performance parameters except for UASs are inhibited during periods of unavailability of the incoming path signal (see FIGS. 11 and 12 for determining beginning and end of unavailable time for incoming signals at these layers).
3. When the accumulation of far end STS Path or VT Path performance parameters at the near end is activated, all far end parameters except for far end UASs are inhibited during periods of unavailability of the path signal at the far end (see FIGS. 13 and 14 for determining beginning and end of unavailable time for far end paths at these layers).
4. When the accumulation of far end STS Path performance parameters at the near end is activated, to ensure valid far end monitoring, far end parameters shall be derived and accumulated only during 1-second intervals during which the near end NE is not (at any point during the second) in the STS Path LOP state or STS Path AIS state for the incoming signal. For those 1-second intervals during which the NE is in the STS Path LOP state or STS Path AIS state for the incoming signal, all far end parameters are overwritten to zero and such counts are flagged as incomplete when queries for that data are processed since such zero counts may not truly reflect the performance experienced at the far end.
5. When the accumulation of far end VT Path performance parameters at the near end is activated, to ensure valid far end monitoring, far end parameters are derived and accumulated only during 1-second intervals during which the near end NE is not (at any point during the second) in the VT Path LOP state or VT Path AIS state for the incoming signal. For those 1-second intervals during which the NE is in the VT Path LOP state or VT Path AIS state for the incoming signal, all far end parameters are overwritten to zero and such counts are flagged as incomplete when queries for that data are processed since such zero counts may not truly reflect the performance experienced at the far end.

Table VII depicts the requirements for PM during troubles according to the requirements above.

TABLE VII

SONET PM Accumulation During Troubles

| Parameter | Trouble | | | | | | | | |
|---|---|---|---|---|---|---|---|---|---|
| | LOS | LOF | Line AIS | STS LOP | STS Path AIS | STS Path Yellow | VT LOP | VT Path AIS | VT Path Yellow |
| Section SEFSs | y | y | y | y | y | y | y | y | y |
| Section CVs | N | N | y | y | y | y | y | y | y |
| Section ESs | y | y | y | y | y | y | y | y | y |
| Section SESs | y | y | y | y | y | y | y | y | y |
| Line CVs | N | N | N | y | y | y | y | y | y |
| Line ESs | y | y | y | y | y | y | y | y | y |
| Line SESs | y | y | y | y | y | y | y | y | y |
| STS PJs | n | n | n | n | n | y | y | y | y |
| PSCs | y | y | y | y | y | y | y | y | y |
| PSD | y | y | y | y | y | y | y | y | y |
| STS Path CVs | N | N | N | N | N | y | y | y | y |
| STS Path ESs | n | n | n | n | n | y | y | y | y |
| STS Path SESs | n | n | n | n | n | y | y | y | y |
| VT PJs | n | n | n | n | n | y | n | n | y |
| STS Path UASs | y | y | y | y | y | y | y | y | y |
| Far End STS CVs | O | O | O | O | O | n | y | y | y |
| Far End STS ESs | O | O | O | O | O | n | y | y | y |
| Far End STA SESs | O | O | O | O | O | n | y | y | y |
| Far End STS UASs | O | O | O | O | O | y | y | y | y |
| VT Path CVs | N | N | N | N | N | y | N | N | y |
| VT Path ESs | n | n | n | n | n | y | n | n | y |
| VT Path SESs | n | n | n | n | n | y | n | n | y |
| VT Path UASs | y | y | y | y | y | y | y | y | y |
| Far End VT CVs | O | O | O | O | O | n | O | O | n |
| Far End VT ESs | O | O | O | O | O | n | O | O | n |
| Far End VT SESs | O | O | O | O | O | n | O | O | n |
| Far End VT UASs | O | O | O | O | O | y | O | O | y | y - indicates the parameter shall continue to be counted/accumulated for seconds during which the trouble is present.
N - indicates the parameter shall be inhibited for all seconds during which the trouble is (at any point during the second) detected as well as during periods of unavailability.
n - indicates that the parameter shall be inhibited during periods of unavailability.
O - indicates the parameter shall be counted as zero and marked as incomplete for each second during which the trouble is (at any point during the second) detected on the incoming signal.

SUMMARY OF THE INVENTION

An object of the present invention is to provide a method and system for testing SONET network elements so that it can be quickly and easily determined that the network elements conform to various accepted criteria and/or standards.

In carrying out the above object and other objects of the present invention, a method is provided for testing a SONET network element having performance monitoring parameters defined for at least one logical layer and capable of performing at least one performance monitoring function. The network element has a normal operating state and a trouble state. The method includes the steps of generating a basic test signal, modifying the basic test signal to obtain a modified test signal, and detecting the modified test signal at the network element to cause the network element to change from the normal operating state to the trouble state. The network element initiates a set of actions in response to the modified test signal. The method also includes the step of monitoring the modified test signal to determine whether the network element is to change back from the trouble state to the normal operating state. The modified test signal includes a first error portion which is followed by a first error-free portion having a first predetermined time period which is followed by a trouble portion having a period sufficiently long to be detected and cause the network element to change from the normal operating state to the trouble state. The trouble portion is followed by a second error-free portion having a second predetermined time period which is followed by the second error portion. The modified test signal tests at least one logical layer. The set of actions includes inhibiting accumulation of the parameters during a time period in which the network element is in the trouble state and accumulating parameters associated with the first and second error portions of the modified test signal.

Further, in carrying out the above object and other objects of the present invention, a method is provided for testing a SONET network element including the step of generating a test signal including a payload pointer initially having a first pointer value and subsequently having a second pointer value different from the first pointer value. The payload pointer indicates the location of the beginning of an incoming synchronous payload envelope (SPE) of the test signal in order to extract a payload signal therefrom. The payload signal includes information bytes having a predetermined pattern. The method also includes the steps of detecting the test signal at the network element so that the network element extracts the payload signal from the SPE and to detect the information bytes having the predetermined pattern, and determining a delay between a first occurrence of the second pointer value and a time when the extracted payload signal includes only the information bytes having the predetermined pattern. The delay indicates how long the network element delays in using the second pointer value.

Systems are also provided for carrying out the above method steps.

The above objects and other objects, features, and advantages of the present invention are readily apparent from the following detailed description of the best mode for carrying out the invention when taken in connection with the accompanying drawings.

BRIEF DESCRIPTION OF THE DRAWINGS

FIG. 10 is a schematic diagram illustrating VT pointer offsets;

FIG. 17 is a diagram showing an example VT NDF test signal and corresponding results.

BEST MODE FOR CARRYING OUT THE INVENTION

Figure 1:
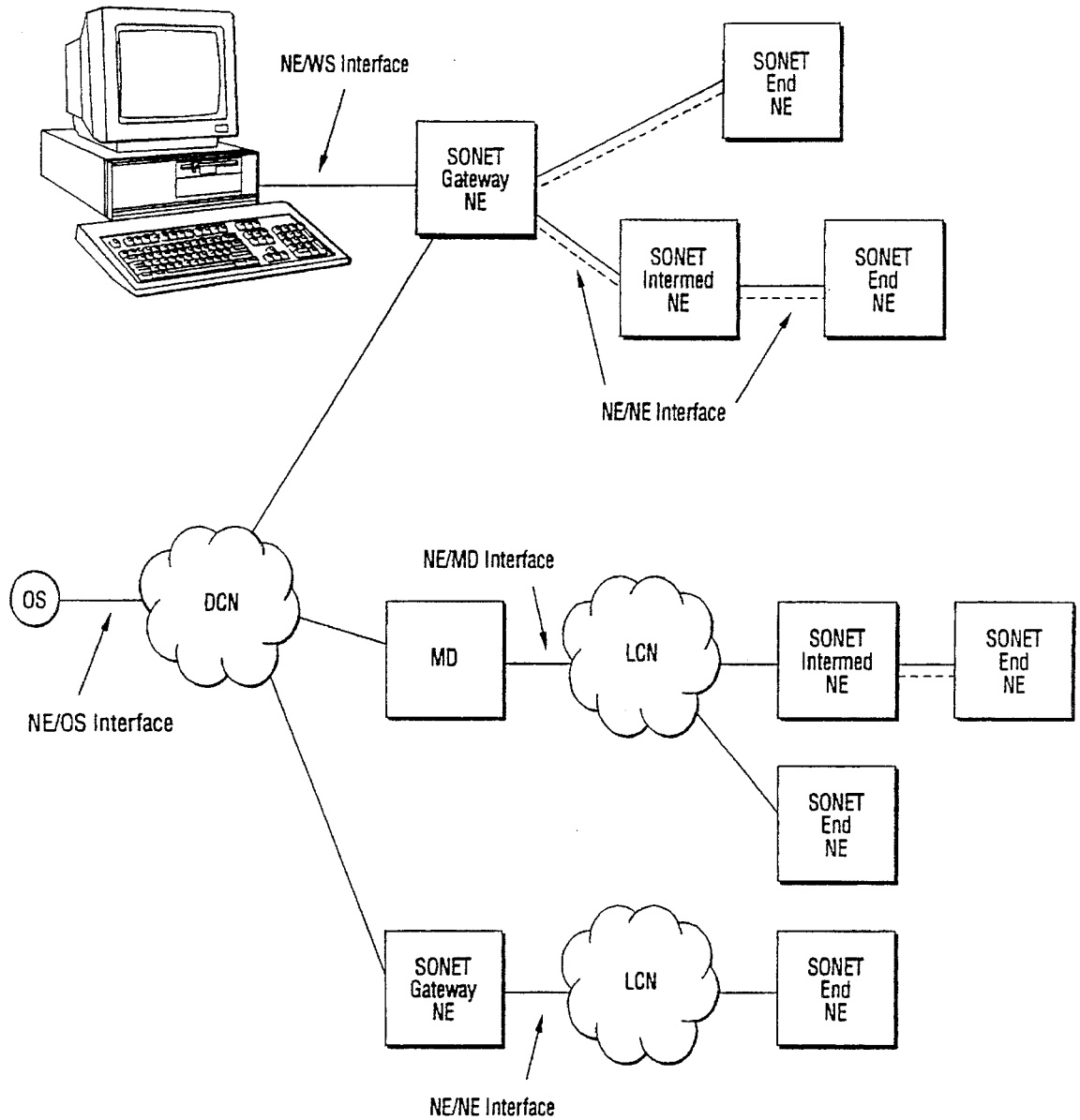
FIG. 1 is a schematic block diagram illustrating various NEs and interface types in SONET operations communications.
Figure 2:
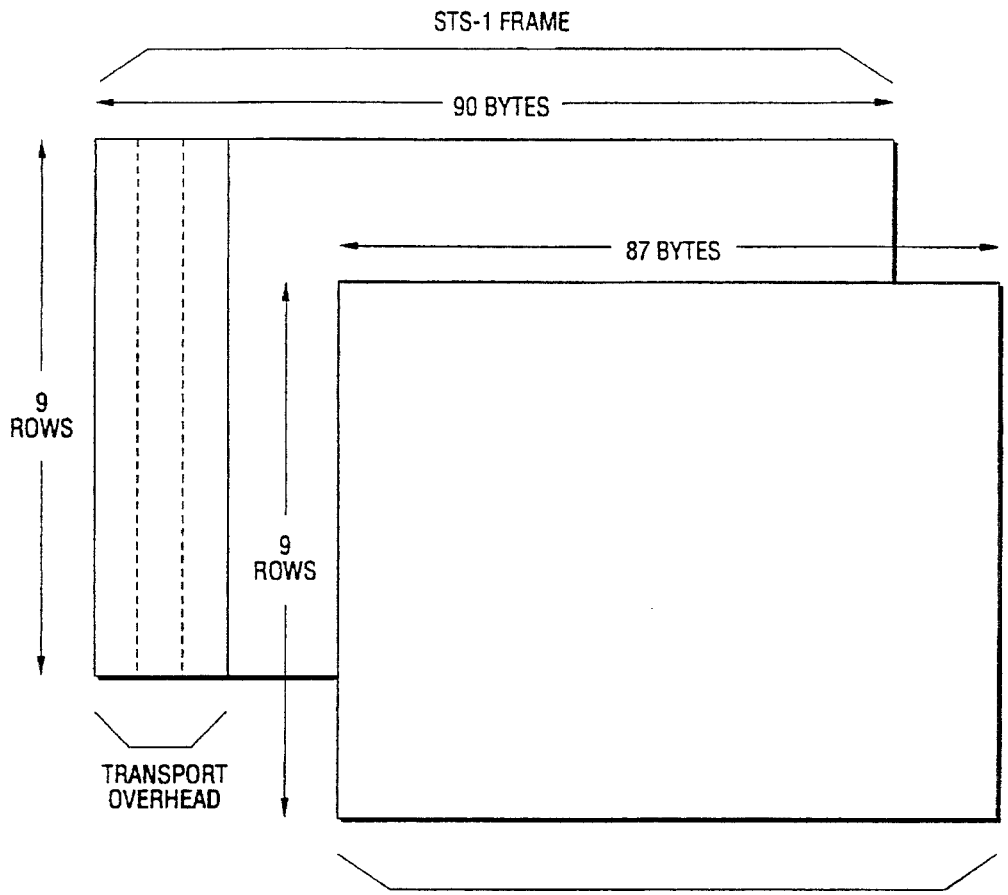
FIG. 2 is a schematic view illustrating the synchronous payload/envelopes (SPE) of a STS-1 frame.
Figure 3:
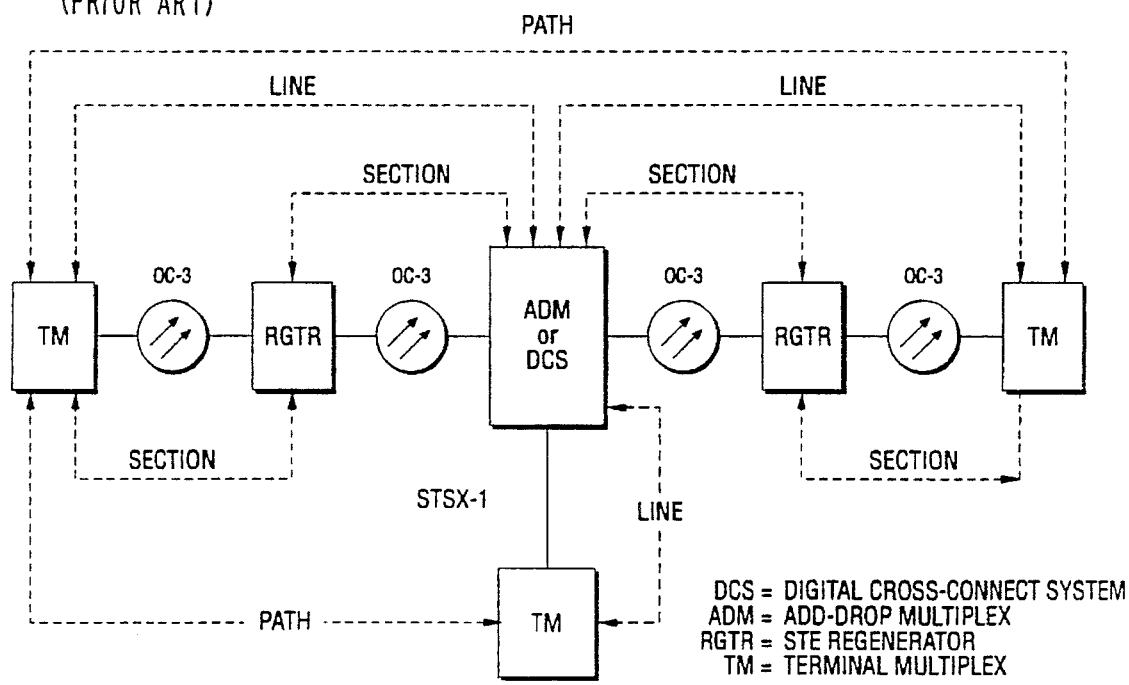
FIG. 3 is a schematic block diagram illustrating SONET sections, line and path definitions.
Figure 4:
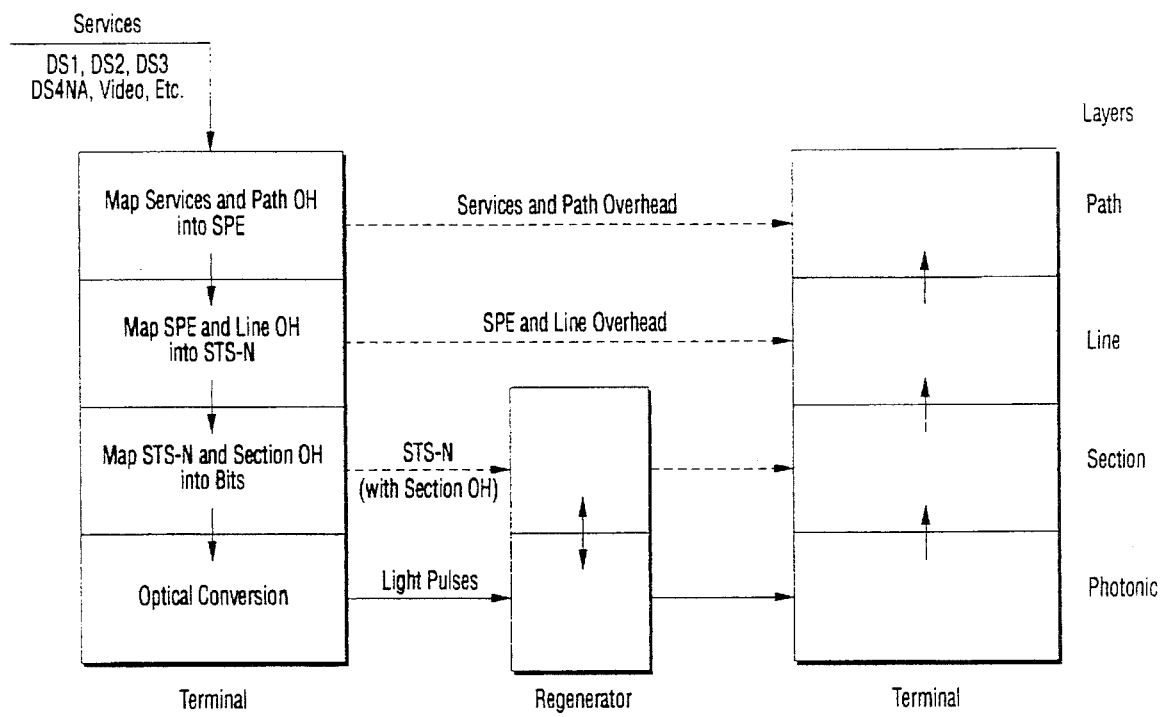
FIG. 4 is a schematic block diagram illustrating various optical interface layers.
Figure 5:
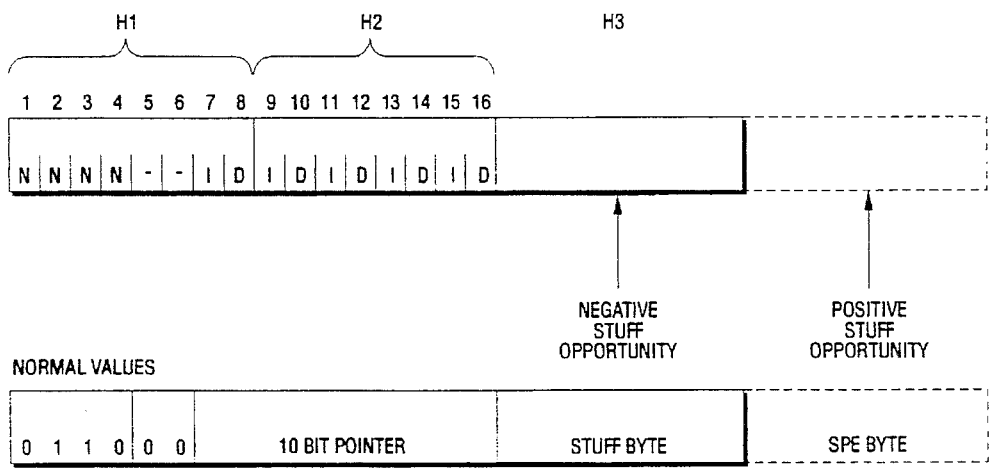
FIG. 5 is a schematic diagram illustrating STS-1 Payload Pointer (H1, H2, H3) Coding.
Figure 6:
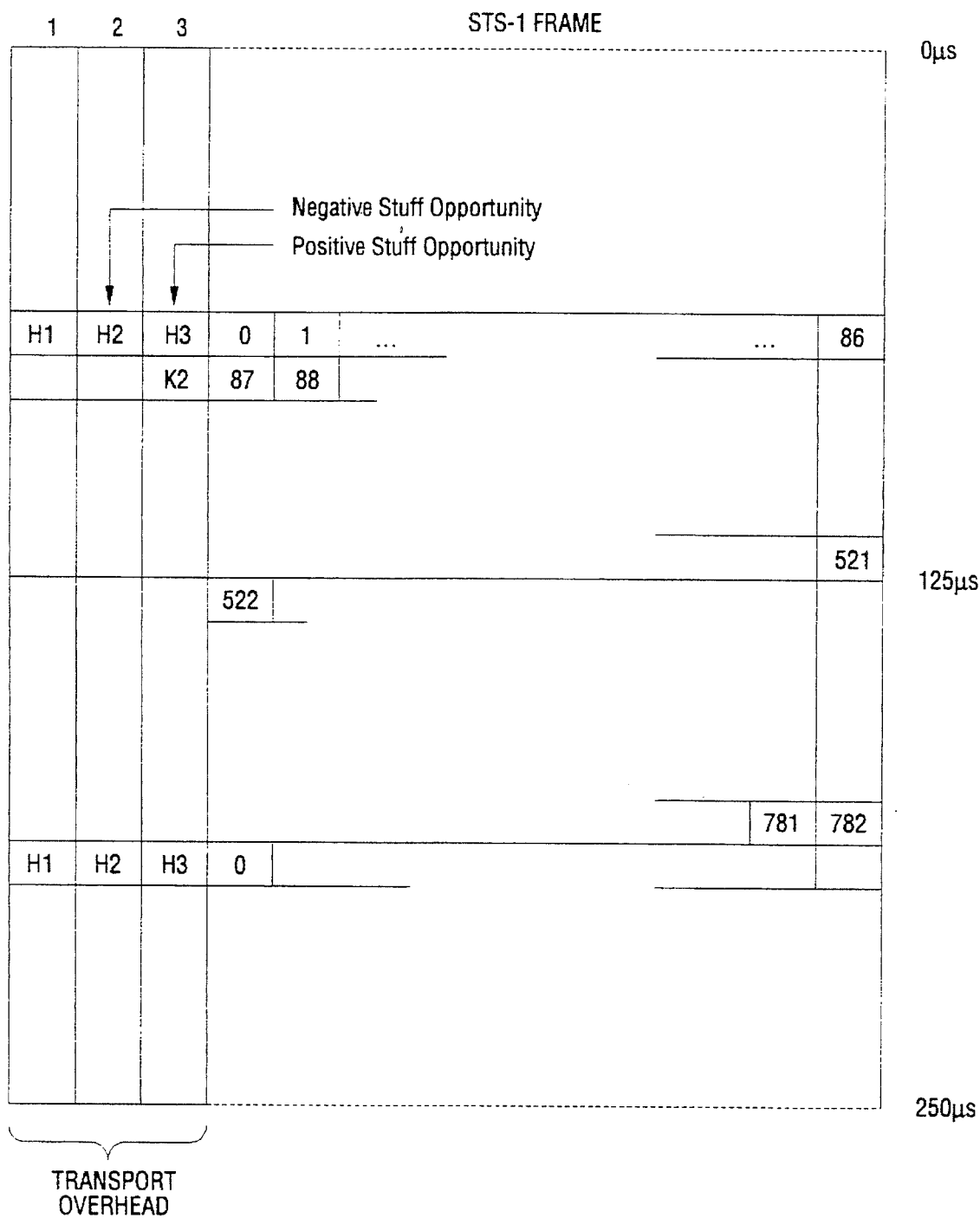
FIG. 6 is a schematic diagram illustrating STS-1 Pointer Offset Numbering.
Figure 7:
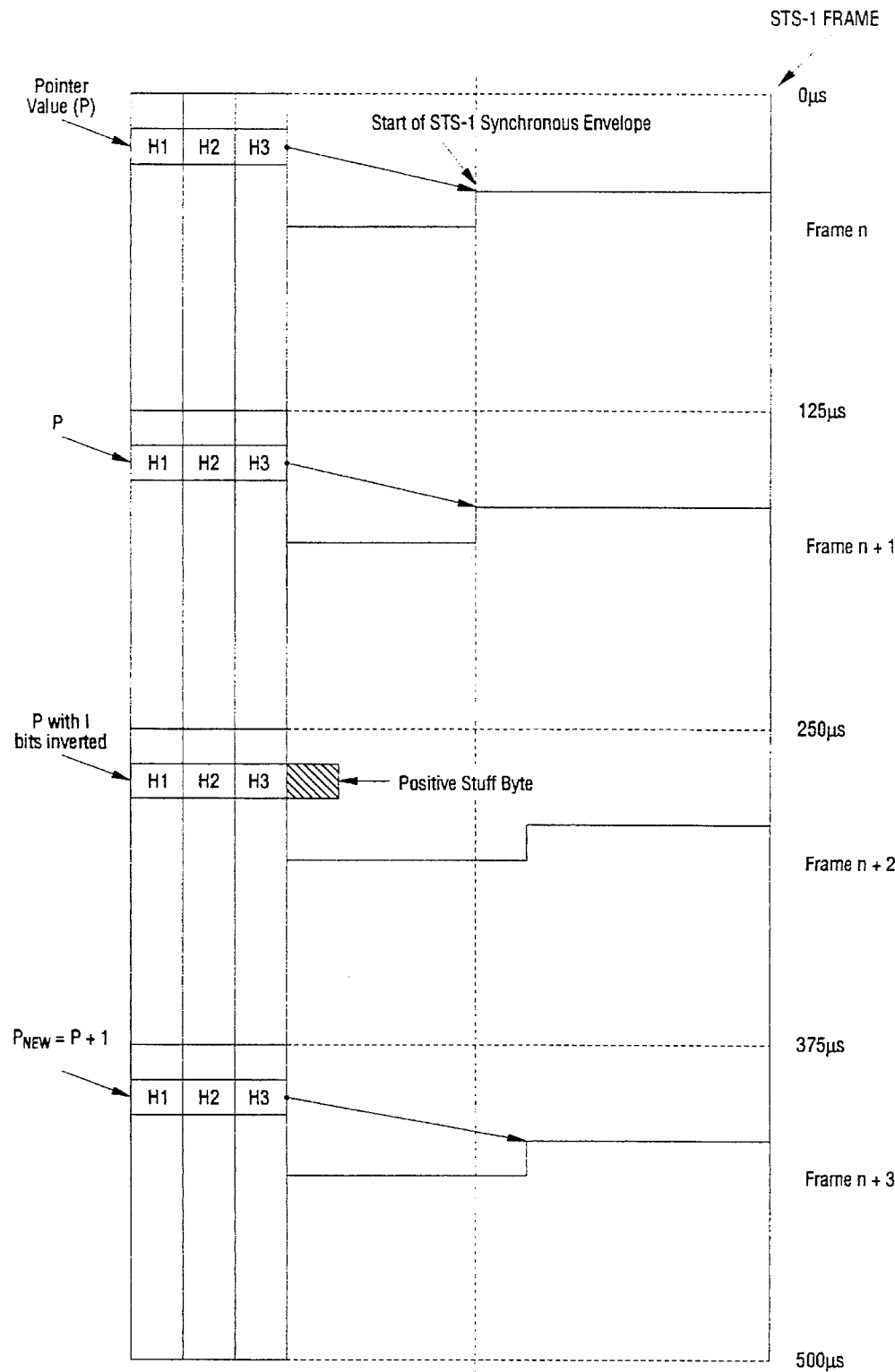
FIG. 7 is a schematic diagram illustrating positive STS-1 Pointer Justification Operation.
Figure 8:
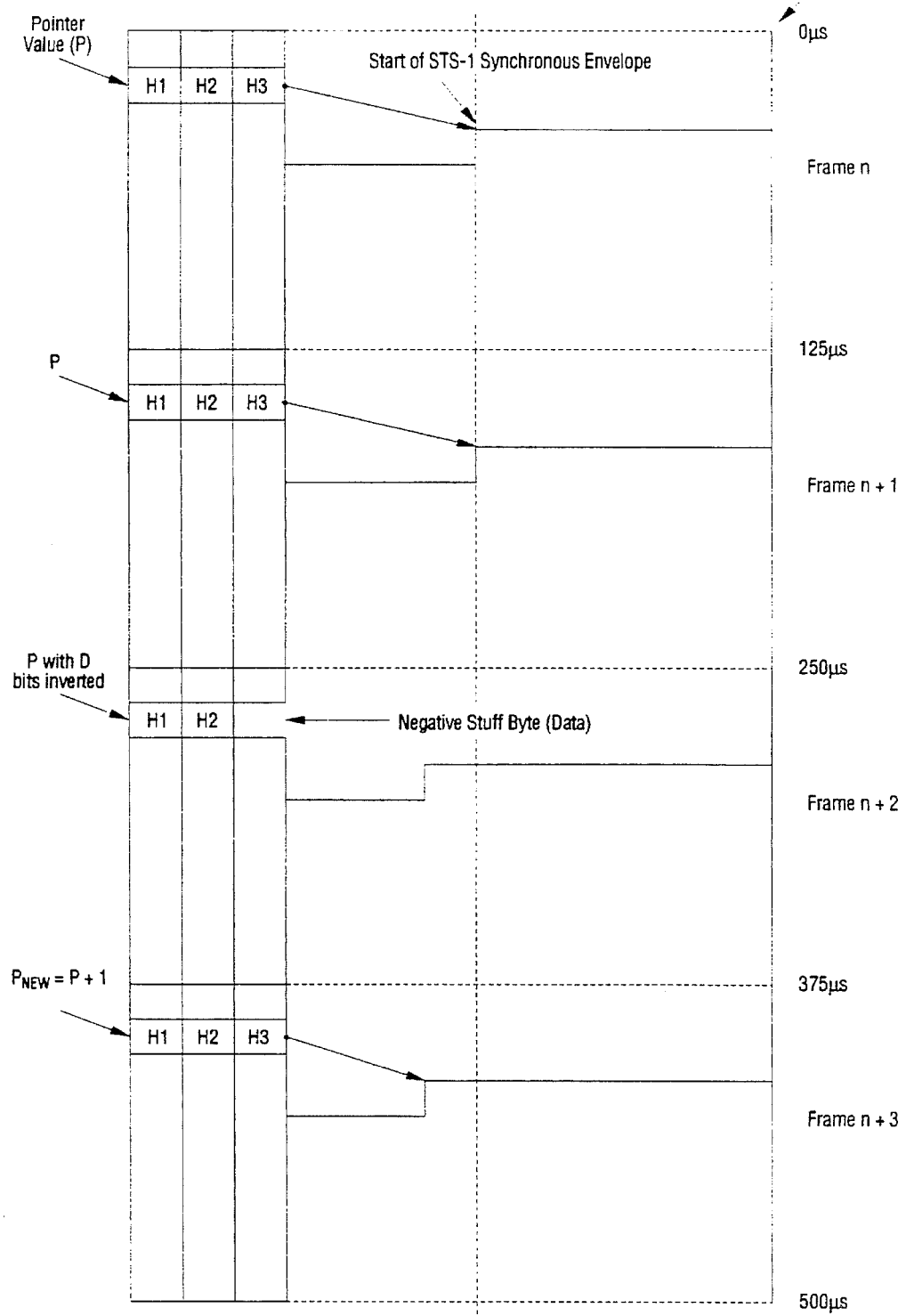
FIG. 8 is a schematic diagram illustrating negative STS-1 Pointer Justification Operation.
Figure 9:
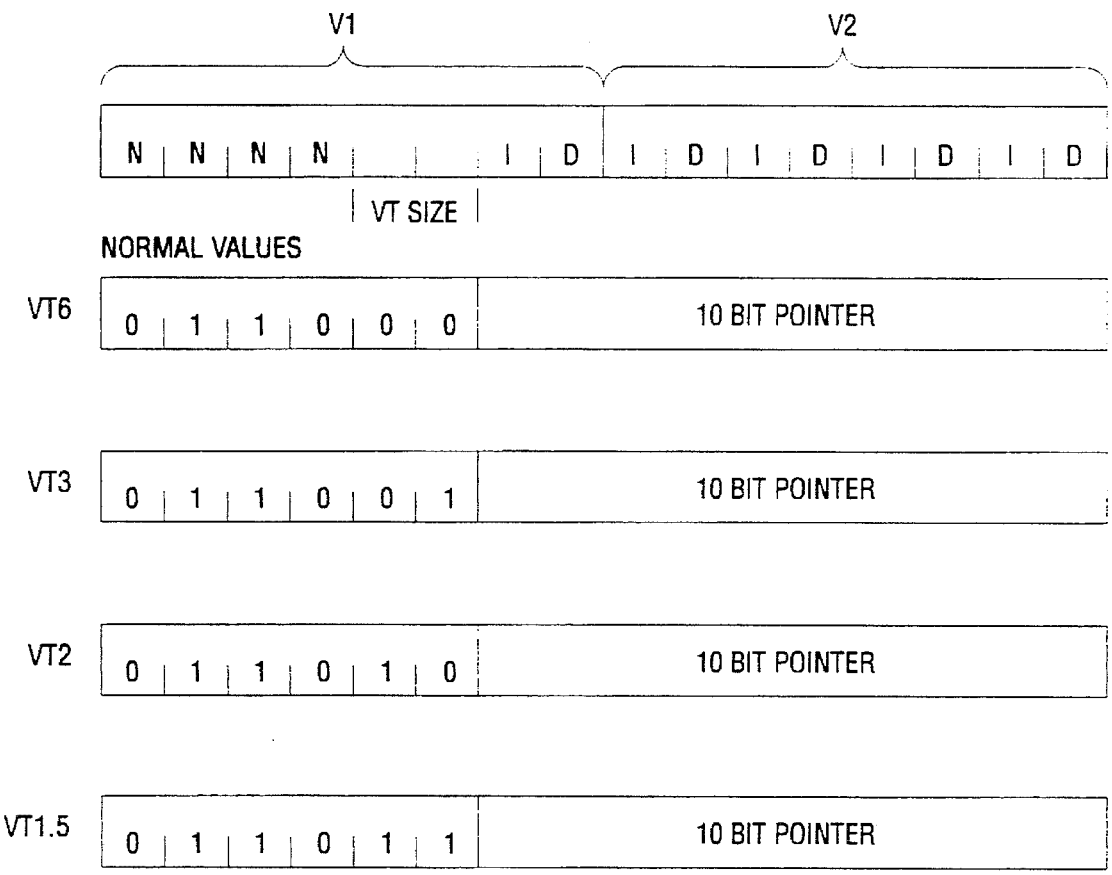
FIG. 9 is a schematic diagram illustrating VT payload pointer coding.

In general, the methods and systems of the present invention are capable of testing SONET network elements (NEs) against selected criteria contained in TR—NWT-000253, Synchronous Optical Network (SONET) Transport Systems: Common Generic Criteria (TR 253). The SONET test set features include a "basic" signal sent by the test set and the ease which the basic signal can be modified to perform the selected tests or to test different types of NEs.

The Basic Signal

One of the most important considerations in testing SONET NEs is the "basic" signal sent by the SONET test set. In general, the tests are performed by changing back and forth between a basic signal and a copy of that signal that has been altered so that it contains some abnormality (e.g., an errored framing pattern, or an all-ones STS pointer word) that the NE is required to detect as an incoming failure or maintenance signal. Any DSn payloads contained in the basic signal are identifiable and detectable on typical DSn test sets.

The basic signal should comply with the criteria in TR 253, Section 3. All of the Section, Line, STS Path, and VT Path (if applicable) overhead bytes contain the required values, all of the "unused" bits and bytes are set to zeros, and the payload mappings are as shown in TR 253. While there is no single basic signal that can be used to test all NEs, factors such as the particular payload mappings and protection switching modes supported by an NE determine the contents of the basic signal needed to test that NE.

STS and VT Pointers—Pointer Generation and Interpretation

Several of the pointer interpretation criteria contain specific detection limits. The limits are given in terms of the number of bits in the pointer word that are inverted from their previous or normal values. If the specified limit (or more) of the appropriate bits are inverted, then the NE is supposed to detect them as an incoming pointer change and take certain immediate actions, but if fewer bits than the limit are inverted, then the NE should ignore them (except for the purpose of determining if it should enter the LOP state).

SONET Performance Monitoring

In general, similar tests need to be performed for each layer of SONET PM supported by the NE, so the capability to perform error insertion at each layer is very important, as is the capability to insert errors at precise rates.

A number of the PM criteria in TR 253 contain detection limits. Some of these limits are given in terms of the number of coding violations that are detected in a second, while others are given in terms of the time a particular type of signal persists. In general, several tests should be performed for each of these criteria. In one test, a signal with exactly the limit for a particular item should be sent to the NE and the NE should be monitored to determine if it takes the appropriate actions (e.g., inhibits the accumulation of certain parameters), while in another test a signal should be sent with just less than the limit to make sure the NE does not take those actions.

General Considerations Test Set Error Insertion Capabilities

Although the insertion of an error into a SONET signal is a very simple concept (i.e., on the signal transmitted by the test set a bit that is supposed to be a "1" gets changed to a "0", or a "0" to a "1"), there are many possible ways that the insertion can be performed. For instance, the errors could be inserted on particular bits within the SONET frame as specified by the user, or they could be inserted "randomly" throughout the signal. Also, the layers at which the inserted errors will cause Coding Violations (CVs) to be counted by an NE depends on the functionality of the particular test set. For instance, if the test set inserts an error in the VT SPE before it calculates any of the BIP codes, then that error would appear on the DS1 dropped from that particular VT, but it would not cause any CVs to be accumulated by the NE. Conversely, if the test set inserts the error after all of the BIPs have been calculated, then it will cause CVs at all of the SONET layers in addition to the DS1 payload error. Several types of error insertion in between these two extremes are also possible, and each method has its own advantages and disadvantages. In general, the PM test procedures can be adapted to the type (or types) of error insertion supported by a particular test set.

In many PM tests, the number of CVs accumulated by the NE should be compared to the number of errors inserted by the test set. If the test set provides precise control of the length of the error insertion period, then the number of errors may be calculated from the insertion time and the error rate. However, if the error insertion period cannot be precisely controlled, then some other method of determining the number of errors is needed. One possibility is that the test set could be designed to display the number of transmitted errors. If that feature is not provided but the test set normally counts the CVs on the signal that it receives, then the number of errors sent could be determined by splitting the optical signal transmitted by the test set and looping one part of that signal back to the test set's receiver, while sending the other part to the NE under test.

Error Insertion Timing Issues

In many PM tests, it is not possible to give specific values for the number of counts that should be accumulated by the NE during the test. The reasons for this is that it is generally not possible to control the relative timing of the error insertion and the NE's PM clock. For example, although it may be possible for the test set to insert one error every 250 frames for exactly 1 second (i.e., 32 errors in 8000 frames), there is no way to make sure that the NE will detect all 32 of the resulting Line CVs as occurring in a single PM second. In this example, it is much more likely that the NE will detect some of the errors at the end of one second, and the rest of them at the beginning of the next second. Thus, the NE would accumulate 2 ESs even though the signal was only errored for one second.

Another factor that affects the expected results in various PM tests is the burstiness of the errors. An example of this appears in the expected ES and Severely Errored Second (SES) counts in the Line SES accumulation test described in Table VIII. In that test, 32 errors per second (that the NE will detect as Line CVs) need to be inserted. Since the maximum number of Line CVs that can be detected in a single OC-3 frame is 24, the errors have to be inserted in 2 or more SONET frames. If the errors are inserted in bursts (e.g. 16 errors in each of two consecutive frames, followed by 7998 error-free frames), then it is expected that in most cases the NE will detect exactly 32 errors during each second of the test, in which case it should count exactly 6 ESs and 6 SESs (for a 6 second test). However, if the test set spreads the errors out over the entire second, it is likely that the start of the test will occur sometime in the middle of a second and end 6 seconds later in the middle of another second, so those two seconds will each contain less than 32 errors. Therefore, the expected result for this case is that the NE should accumulate 7 ESs and only 5 SESs. Also, in the case where the errors are spread out over the entire second, a frequency offset between the timing references for the NE and the test set could cause the NE to occasionally detect only 31 errors in a second. For that reason, to test the upper detection limit it is recommended that an average error rate slightly greater than the limit (e.g. 32.1 CVs/second) be used instead. Similarly, to test the NE's response to errors just under the limit, it is recommended that an average error rate slightly less that the limit (e.g. 30.9 CVs/second) be used. (Note that for an error rate of 30.9 CVs/second, 9 out of every 10 seconds would be expected to contain 31 errors, and the remaining second would contain 30 errors).

TABLE VIII

| | SONET Performance Monitoring, General | |
|---|---|---|
| Example Criteria[1] | Test Method | |
| (R) All possible numbers of BIP errors (e.g. 0 to 24 errors in a single frame for the OC-3 Line Layer), are detected and accumulated as CVs. | Send a signal containing a single frame with 1 B2 error. The NE must accumulate 1 Line CV, and 1 ES. Send a signal containing a single frame with 24 B2 errors. The NE must accumulate 24 Line CVs, and 1 ES. | |
| (R) For an OC-3 line, a second containing 32 or more Line CVs is a Line SES (and a Line ES). | Send a signal containing periodic B2 errors at a rate of 32 per second for 6 seconds[2]. The NE must accumulate the correct total number of Line CVs, 7 or 6 ESs, and 5 or 6 SESs.[3] Send a signal containing periodic B2 errors at a rate of 31 per second for 6 seconds. The NE must accumulate the correct total number of Line CVs, 7 or 6 ESs, and 0 SESs.[3] | |
| (R) An NE with an off-line framer accumulates a Section SEFS for any second in which it detects a COFA (or is in the LOS or LOF state). (R) An NE with an on-line framer accumulates a Section SEFS for any second in which it is in the OOF (or LOS or LOF) state. | Send a signal with x−1 consecutive frames containing single bit errors in the framing pattern.[4] The NE must accumulate the correct number of Section CVs and ESs, and 0 SEFSs and SESs.[5] Send a signal containing an arbitrary change in the frame alignment. The NE must accumulate 1 Section SEFS, 1 ES, and 1 SES. It should also accumulate a burst of CVs. (CVs should be detected in approximately x+2 frames, with a maximum of 8 CVs per frame). Send a signal with x consecutive frames containing single bit errors in the framing pattern. An NE with an on-line framer must accumulate 1 Section SEFS, ES, and SES, and also a burst of CVs. An NE with an off-line framer must accumulate the correct number of CV and ESs, and 0 SEFSs and SESs.[5] Send a signal containing a short (e.g., 4 ms) LOS or LOF. The NE must accumulate 0 Section CVs, and 1 SEFS, ES and SES. | |

TABLE VIII-continued

SONET Performance Monitoring, General

| Example Criteria[1] | Test Method |
|---|---|
| | Send a signal containing a 20 second LOS or LOF. The NE must accumulate 0 CVs, and 20 or 21 SEFS, ESs and SESs. |

[1]Criteria statements from TR 253 are paraphrased below.
[2]The 6 second test duration given in this example is arbitrary. If the NE being tested does not accumulate Line UASs, then any convenient test duration could be used. However, if the NE does accumulate Line UASs, then the test duration should be less than 10 seconds, and the Line UAS parameter should be tested separately.
[3]See Error Insertion Timing Issues.
[4]The meaning of "x" depends on whether the NE uses the proposed ANSI definition of a SEFS, or one of the TR 253 definitions. If the ANSI definition is used, the x is part of the SEFS definition and is equal to 4. If the TR 253 definition is used, then x is the number of consecutive frames that must contain errored framing patterns for a particular NE to detect an OOF. In the TR 253 case, x is NE dependent and can equal either 4 or 5.
[5]The number of CVs, ESs, and SESs accumulated with depend on the functionality of the test set. If the test set inserts errors into the framing pattern before the B1 BIP-8 code is calculated, then the NE should detect 0 CVs, ESs and SESs. However, if the test set inserts the errors after B1 is calculated, then the NE should detect x−1 or x CVs, 1 ES and 0 SESs.

Failure Insertion Timing Issues

Similar to the error insertion timing discussed above in the tests of an NE's PM accumulation during incoming "troubles" (i.e., failures or AISs), there is generally no way to control the timing of the start of the trouble with respect to the NE's PM clock. In most tests, the trouble will be inserted sometime in the middle of a second so that any resulting CVs will appear to the NE to have occurred in the same second as the entry into the trouble state (in which case the accumulation of CVs at certain SONET levels are required to be inhibited). However, there is the possibility that the trouble will begin (and cause CVs) just before the end of one second, but the NE will not enter the trouble state until after the start of the next second. If this occurs, then it will appear that the NE failed to inhibit the accumulation of CVs during seconds in which it was in a trouble state, when in fact the CVs were detected in the previous second.

Another timing issue is the length of time that the failure must be inserted, which is affected by the architecture of the NE. As an example, one possible architecture for an NE that terminates an OC—N signal and provides DS1 interfaces on its low-speed side consists of a high speed circuit pack, several medium speed packs, and a number of low speed packs. The high speed pack could terminate the OC—N signal and perform STS pointer processing before sending STS-1 signals to the medium speed packs. The medium speed packs could then terminate the STS-1s and send the VT1.5 signals on to the low speed packs. Finally, the low speed packs could terminate the VTs and output the DS1 traffic. In this architecture, the low speed pack could be responsible for detecting VT LOP and VT AIS, and for performing the VT Path PM function. Since this pack would not be able to distinguish between a VT AIS originated by a separate NE and a VT AIS that was inserted by the high or medium speed pack in response to some higher level failure or AIS, it may not have any way of "knowing" which failure or AIS state the NE (as a whole) is in. Only the knowledge that it (the low speed pack) is in the VT LOP or AIS state may be available at the device where the VT Path PM is accumulated.

In most cases, the possibility that the device performing the VT Path PM might not know the state of the NE as a whole should not make a difference in the PM accumulation. For the architecture described above, if the NE is in the LOS state on the active OC—N line, then the low speed pack should receive VT AIS (from the medium speed pack) and the criteria for VT Path PM are the same whether the NE is in the LOS state or the VT AIS state during a particular second. In either case, Table VII indicates that VT Path CVs must not be accumulated for those seconds. The difference could occur for a very short LOS. With this particular architecture, the LOS would need to last for more than 12 frames for the low speed card to detect the VT AIS state. Thus, if the LOS lasts for less than 12 frames, then the accumulation of VT Path CVs might not be inhibited. Also, the 12 frames delay between the detection of LOS at the high speed pack and the detection of VT AIS at the low speed pack would increase the chance that the failure would start in one second but the entry into the state that causes the CV counts to be inhibited would not occur until the next second.

Protection Switching Considerations For Path PM

When an NE performs a protection switch it is expected that there will be some effect on the Path PM parameters, and that effect should depend on the cause of the switch. If a Line failure or AIS is the cause of the switch, then the NE should inhibit the accumulation of Path CVs during the second in which the switch occurs, but it should count 1 ES and 1 SES on each affected Path (assuming the start of the failure and the switch occur in the same second). However, if the switch has some other cause (e.g., an SD condition on the active OC—N line), then the NE would be expected to detect a small burst of Path CVs during the switch, and those CVs should be accumulated along with any resulting ESs and SESs.

As noted previously, when Table VII indicates that the accumulation of Path CVs must be inhibited for seconds in which the NE is in a Line failure or AIS state, it is really only referring to Line failures or AISs that are detected on an active OC—N line. Similarly, when the table indicates that the accumulation of STS and VT path ESs and SESs must be inhibited during unavailable time caused by a declared Line failure or AIS condition, it is really only referring to failures or AISs that occur on an active line and where a protection switch does not restore the Path. If the failure occurs on a standby line, or a protection switch restores the Path, then the Path is not unavailable. Therefore, any tests related to the accumulation of Path PM parameters during a declared Line failure or AIS would need to be performed with the NE configured or provisioned so that a switch cannot occur.

The NE may also have to be configured to prevent a protection switch in a number of other Path PM tests, if errors that are inserted by the test set to cause STS or VT CVs also cause Line CVs. If switches are not prevented for some of these tests, then an undesired switch caused by an SD condition could occur.

Applicability of Tests to Various SONET Layers

In SONET, three common PM parameters (i.e., CVs, ESs, and SESs) are defined at the Section, Line, STS path and VT Path layers, along with various parameters that are only applicable to some of those layers. In TR 253, the additional parameters that are defined are SEFSs at the Section layer, Pointer Justifications (PJs) at the Line and STS Path layers, and UASs at the STS and VT Path layers.

In general, if a parameter is defined for more than one layer, then the procedures for testing the accumulation of that parameter are basically the same at each layer. Therefore, when example tests are given, they often refer to a specific layer, but the procedures could easily be modified to test the same parameter at a different layer. Also, most of the procedures described, test the NE's accumulation of more than one parameter. Thus, even though there is not a specific section describing test procedures for the accumulation of ESs, that capability is tested as part of a number of other tests.

PM During Seconds With Failures And AISs

Table IX lists several example tests that could be used to test an NE against the various criteria related to PM during seconds in which the NE is in a failure or AIS (trouble) state, but which are not considered to be unavailable time. These examples refer specifically to the accumulation of STS Path parameters, but similar tests could be performed for the other layers. For the VT Path layer the primary difference would be that the NE's response to VT LOP and VT AIS should also be tested. At the Line and Section layers, the PM accumulation should be independent of any protection switches that may occur, so the third test listed would not be necessary. Also, only Line failures should affect the accumulation of Section CVs, and only Line failures and AIS should affect the Line CVs.

Figure 15:
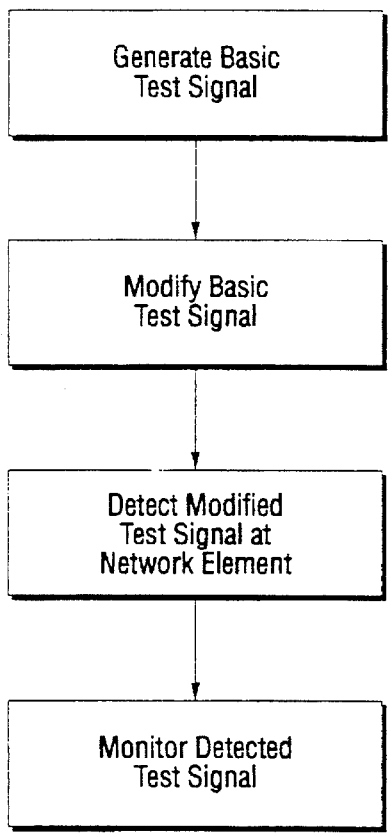
FIG. 15 is a block diagram flow chart illustrating one method of the present invention.

Referring now to FIG. 15, in the first two of the example tests, a single error is sent one second before the start of the trouble, and two more errors are sent one second after the end of the trouble. These errors are intended to test if the NE only inhibits the accumulation during the correct seconds. They should be sent a full second before and after the trouble so that they cannot be detected as occurring in the same second as the trouble and the NE will be required to accumulate them.

TABLE IX

SONET Performance Monitoring, Inhibition Of CV Accumulation

| Example Criteria | Test Method |
| --- | --- |
| (R) The accumulation of STS Path CVs is inhibited during all seconds in which the NE is in the LOS, LOF, Line AIS, STS LOP or STS Path AIS state (at any time during the second). | With the standby OC-N line failed or locked out and the alarm delay set for 2.5 seconds, send a signal containing the following:<br>1 B3 error<br>1 second of error-free signal<br>a short failure or AIS (that lasts long enough for it to be detected by the part of the NE performing the STS Path PM function*)<br>1 second of error-free signal<br>2 more B3 errors.<br>The NE should accumulate 3 STS Path CVs and ESs, 1 SES and 0 UASs. |
| If the state does not persist long enough for the failure or AIS condition to be declared, then the accumulation of the other near end parameters is not inhibited. | With the standby OC-N line failed or locked out and the alarm delay set for 10 seconds, send a signal containing the following:<br>1 B3 error<br>1 second of error-free signal<br>5 seconds of failure or AIS - trouble<br>1 second of error-free signal<br>2 more B3 errors.<br>The NE should accumulate 3 STS Path CVs, 7 or 8 ESs, 5 or 6 SESs, and 0 UASs. |
| If a protection switch restores the Path, then the accumulation of the other near end parameters is not inhibited even if the condition is declared. | With the standby OC-N line available for protection switching, send a signal containing the following:<br>1 B3 error<br>1 second of error-free signal<br>20 seconds of Line failure or AIS.<br>The NE should perform a protection switch, and accumulate 1 STS Path CV, 2 ESs, 1 SES, and 0 UASs. |

*See Failure Insertion Timing Issues.

PM Accumulation During Unavailable Time

Tables X and XI list example tests that could be used to test an NE against the criteria related to the accumulation of PM parameters during unavailable time. Similar to a number of the previous tests, these refer specifically to the accumulation of the STS Path parameters. In this case, the tests for the VT Path parameters would be very similar, and if an NE provides a Line UAS parameter then these tests could also be used at the Line layer without any change in the expected results. For the Section layer parameters (and the Line layer parameters if the NE does not provide a Line UAS parameter) the tests should still be performed, although the expected results would be different. Some SONET NEs that have been analyzed have incorrectly inhibited the accumulation of Line parameters in certain situations, even though a line UAS parameter was not provided.

TABLE X

SONET Performance Monitoring, Unavailable Time Caused By Failures And AISs

| Example Criteria | Test Method |
| --- | --- |
| (R) The accumulation of STS Path CVs, ESs, and SESs are inhibited during unavailable time caused by a declared LOS, LOF, Line AIS, STS LOP, or STS AIS condition. STS Path UASs are accumulated during that time. The time that the NE considers to be unavailable time is consistent with FIGS. 11 and 12. | With the standby OC-N line failed or locked out and the alarm delay set for 2.5 seconds, send a signal containing the following:<br>1 B3 error<br>1 second of error-free signal<br>5 seconds of failure or AIS<br>1 second of error-free signal<br>2 more B3 errors.<br>The NE should accumulate 3 STS Path CVs, 2 ESs, 0 SESs and 5 or 6 UASs. |
| The time that the NE considers to be unavailable time is consistent with FIGS. 11 and 12 (trouble reappears during clear delay). | With the standby OC-N line failed or locked out, the alarm delay set to 2.5 seconds, and the clear delay set to 15 seconds, send a signal containing the following:<br>1 B3 error<br>1 second of error-free signal<br>10 seconds of failure or AIS<br>12 seconds of error-free signal<br>1 second of failure or AIS<br>12 seconds of error-free signal<br>1 second of failure or AIS<br>1 second of error-free signal<br>2 more B3 errors.<br>The NE should accumulate 3 STS Path CVs, 2 ESs, 0 SESs, and 36 or 37 UASs. |
| The time that the NE considers to be unavailable time is consistent with FIGS. 11 and 12 (SESs occurring immediately before the trouble, and during the clear delay period). | With the standby OC-N line failed or locked out, the alarm delay set to 2.5 seconds, and the clear delay set to 15 seconds, send a signal containing the following:<br>1 B3 error<br>1 second of error-free signal<br>5 seconds with a burst of 10 B3 errors each second<br>10 seconds of failure or AIS<br>8 seconds of error-free signal<br>4 seconds with a burst of 10 B3 errors each second<br>1 second of error-free signal<br>2 more B3 errors.<br>The NE should accumulate 3 STS Path CVs, 2 ESs, 0 SESs, and 27 or 28 UASs. |
| The time that the NE considers to be unavailable time is consistent with FIGS. 11 and 12 (even if the trouble clears, the unavailable time is not considered to be over until the start of 10 consecutive seconds that are not SESs). | With the standby OC-N line failed or locked out, the alarm delay set to 2.5 seconds, and the clear delay set to 5 seconds, send a signal containing the following:<br>1 B3 error<br>1 second of error-free signal<br>10 seconds of failure or AIS<br>8 seconds of error-free signal<br>8 seconds with 10 B3 errors per second<br>2 seconds of error-free signal<br>8 seconds with 10 B3 errors per second<br>1 second of error-free signal<br>2 more B3 errors.<br>The NE should accumulate 3 STS Path CVs, 2 ESs, 0 SESs, and 36 or 37 UASs. |

TABLE XI

SONET Performance Monitoring, Unavailable Time Caused By Consecutive SESs

| Example Criteria | Test Method |
| --- | --- |
| (R) The accumulation of STS Path CVs, ESs, and SESs are inhibited during unavailable time caused by 10 or more consecutive SESs. STS Path UASs are accumulated during that time. | Send a signal containing the following:<br>9 seconds with a burst of 10 B3 errors each second<br>2 error-free seconds<br>9 seconds with a burst of 10 B3 errors each second.<br>The NE must accumulate 180 STS Path CVs, 18 ESs, 18 SES, and 0 UASs. |
| The time that the NE considers to be unavailable time is | Send a signal containing the following:<br>1 B3 error |

TABLE XI-continued

SONET Performance Monitoring,
Unavailable Time Caused By Consecutive SESs

Figure 11:
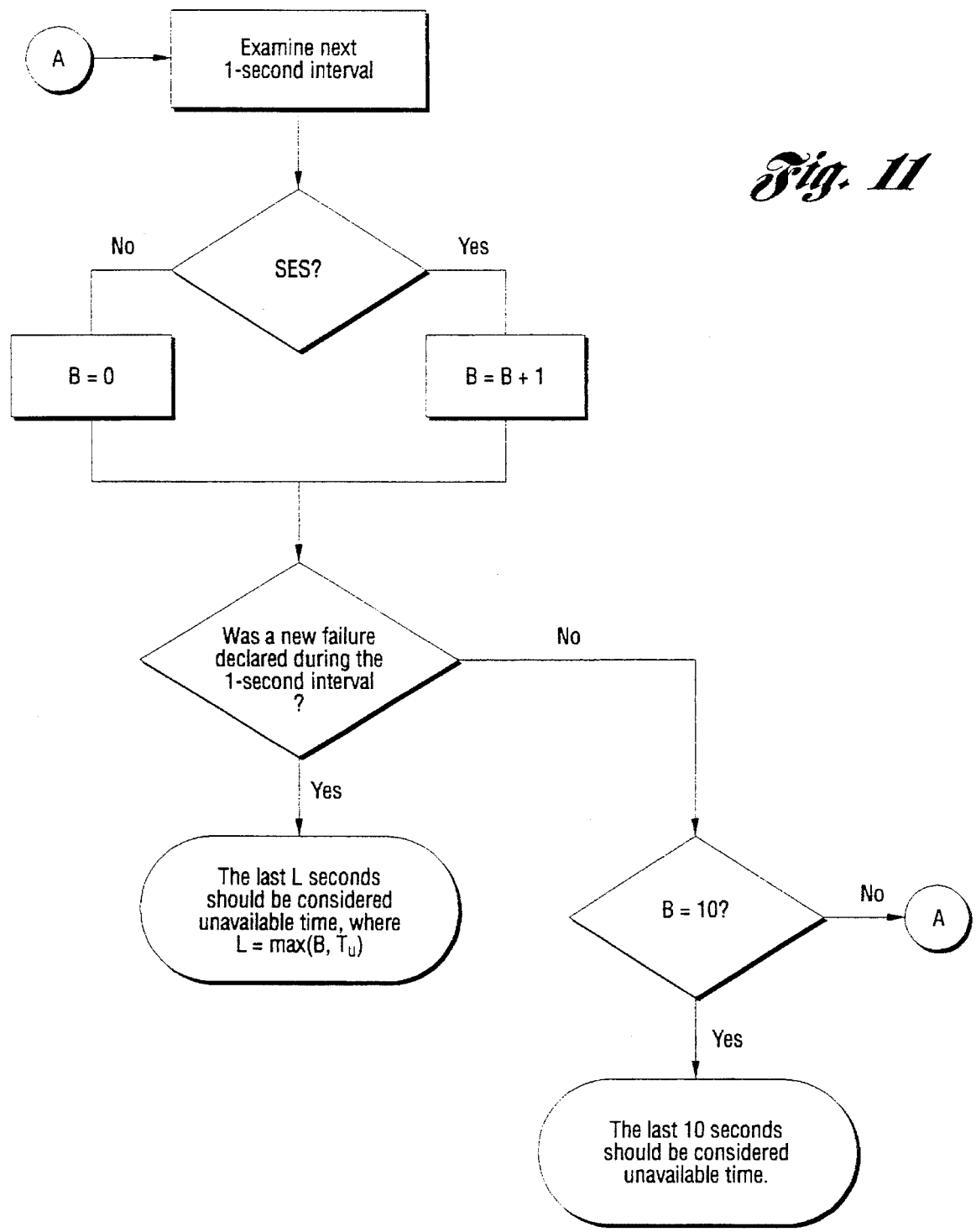
FIG. 11 is a block diagram flow chart illustrating a process for determining the beginning of unavailable time for an incoming STS or VT path.
Figure 12:
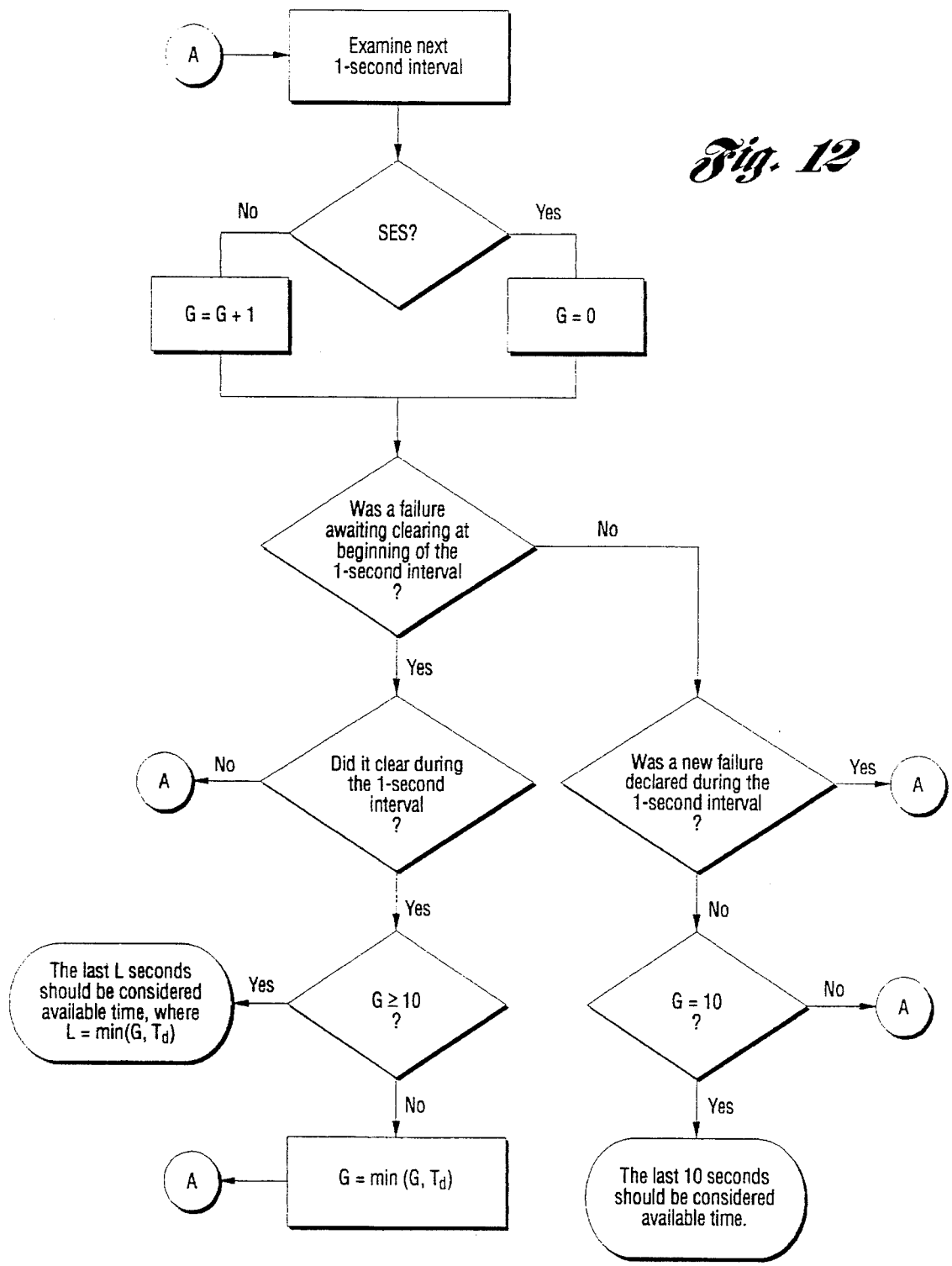
FIG. 12 is a block diagram flow chart illustrating a process for determining the end of unavailable time for an incoming STS or VT path.
Figure 13:
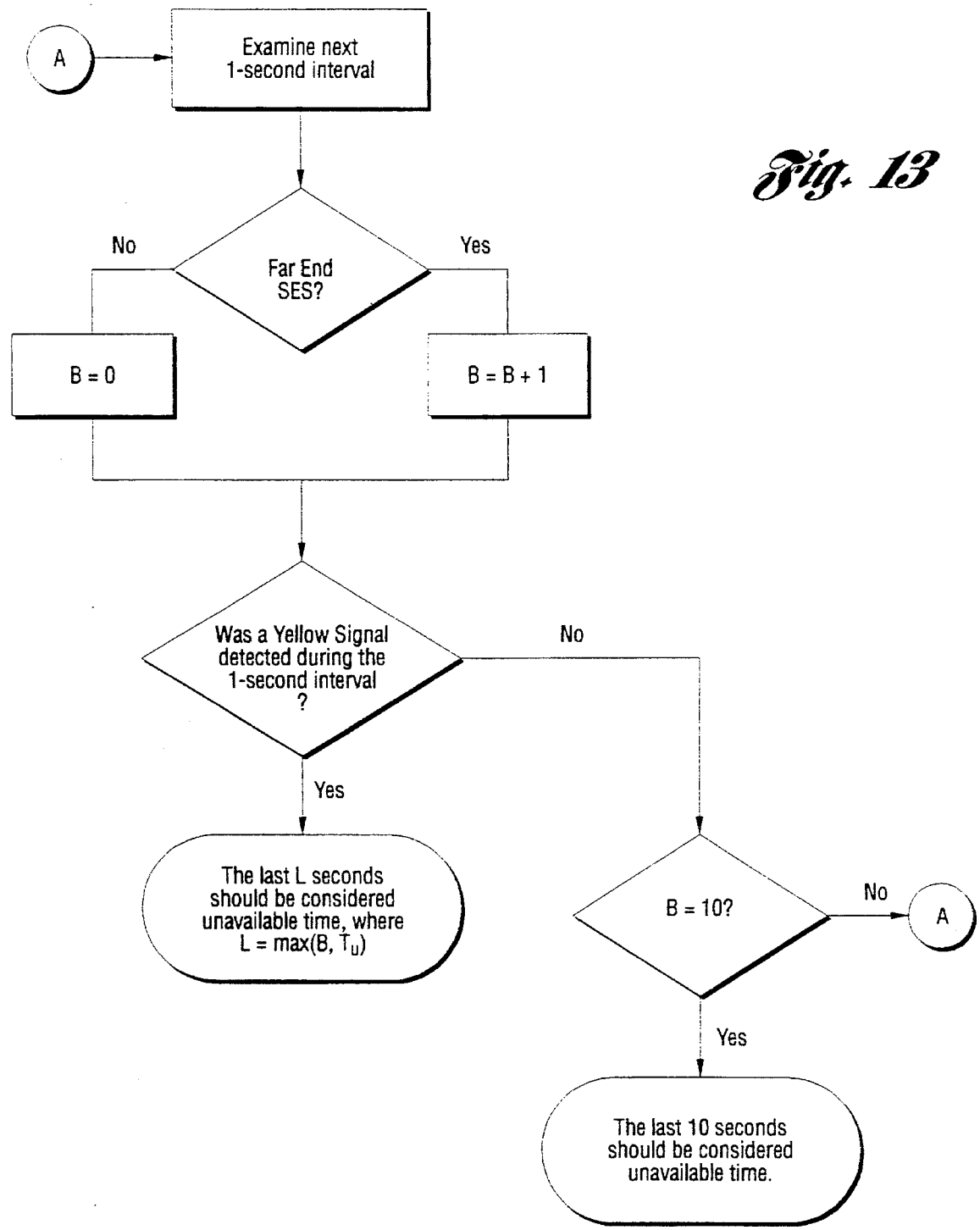
FIG. 13 is a block diagram flow chart illustrating a process for determining the beginning of unavailable time for a far end STS or VT path.
Figure 14:
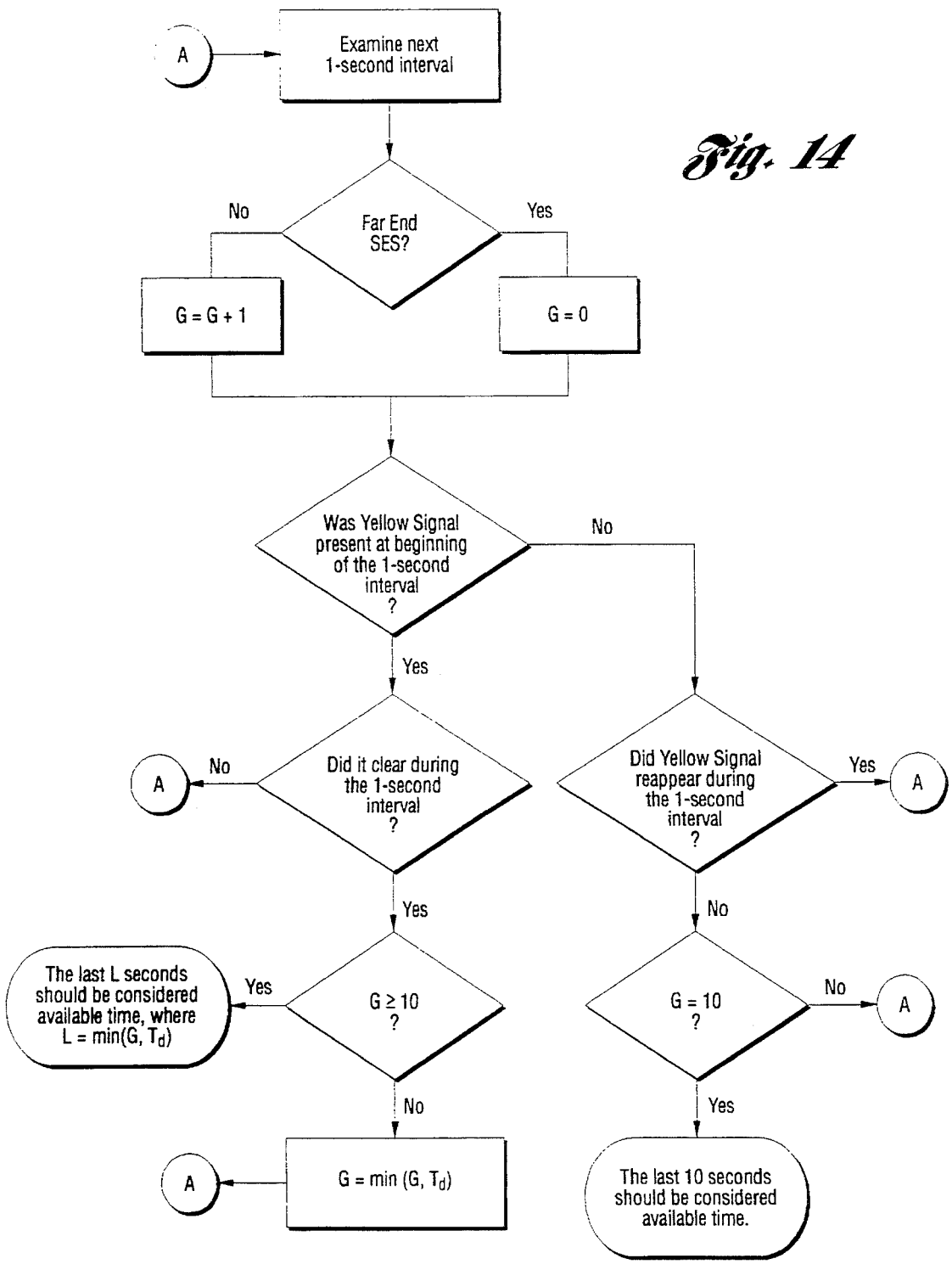
FIG. 14 is a block diagram flow chart illustrating a process for determining the end of unavailable time for a far end STS or VT path.

| Example Criteria | Test Method |
| --- | --- |
| consistent with FIGS. 11 and 12 (not considered unavailable time until the start of 10 consecutive seconds that are SESs). | 1 second of error-free signal<br>6 seconds with a burst of 10 B3 errors each second<br>2 error-free seconds<br>10 seconds with a burst of 10 B3 errors each second<br>1 second of error-free signal<br>2 more B3 errors.<br>The NE must accumulate 63 CVs, 8 ES, 6 SESs, and 10 UASs. |
| The time the NE considers to be unavailable time is consistent with FIGS. 11 and 12 (unavailable time is not exited until the start of 10 consecutive seconds that are not SESs). | Send a signal containing the following:<br>1 B3 error<br>1 second of error-free signal<br>10 seconds with a burst of 10 B3 errors each second<br>8 error free seconds<br>6 seconds with a burst of 10 B3 errors each second<br>1 second of error-free signal<br>2 more B3 errors.<br>The NE must accumulate 3 CVs, 2 ES, 0 SESs, and 24 UASs. |

When a UAS parameter is provided at a particular layer, there are two main types of incoming signals that should cause the NE to consider a period of time to be unavailable. The first of these is a declared failure or AIS condition that affects the line or path being monitored, and the second is a signal with 10 or more consecutive SESs at that layer. Both of these types of signals are covered in the examples, as are the criteria for entering and exiting unavailable time which are illustrated in FIGS. 11 and 12. It is important to remember that a Line failure or AIS should only cause unavailable time at the Path layer if it affects the path (i.e. it occurs on the active OC—N line), and the path is not restored by a protection switch.

As in several of the tests described previously, in several of these tests a single error is sent one second before the start of the trouble or string of consecutive SESs, and two more errors are sent one second after the end of the trouble. These errors are intended to test if the NE only inhibits the accumulation during the correct seconds. They should be sent a full second before and after the trouble so that they cannot be detected as occurring in the same second as the trouble and the NE will be required to accumulate them. In addition, for these errors to be apparent in the performance monitoring PM data, the errors that are intended to cause an SES should be inserted in a short burst. Otherwise, they may be detected as occurring in two separate 1-second intervals and the first and last seconds in which they are inserted will not contain enough errors to be counted as SESs. If this occurs, then the counts from those two seconds could mask the other counts.

Far End PM

In TR 253, the capability to accumulate several far end STS and VT Path PM parameters is required for Path terminating NEs. These parameters are very similar to the near end Path parameters, and are based on the STS and VT Path Far End Block Error (FEBE) codes and Yellow signals received from the far end Path terminating NE. In general, to test an NE's far end PM, a SONET test set needs to be capable of sending FEBE codes at various rates and Yellow signals for various time periods, as specified by the user.

NDF Results

When an NE that terminates an STS or VT receives a set NDF, it must use the pointer value accompanying that NDF to interpret the incoming SPE and extract the payload. The NE is required to start using the new pointer value at the first occurrence of the offset indicated by that pointer, and tests can be designed to determine if the NE meets that requirement. However, the interpretation of the results of those tests may be dependent on the NE's internal architecture. Given below is a description of test signals that can be used in the NDF tests, and several items that should be considered when the test results are interpreted.

NDF Test Signals

Figure 16:
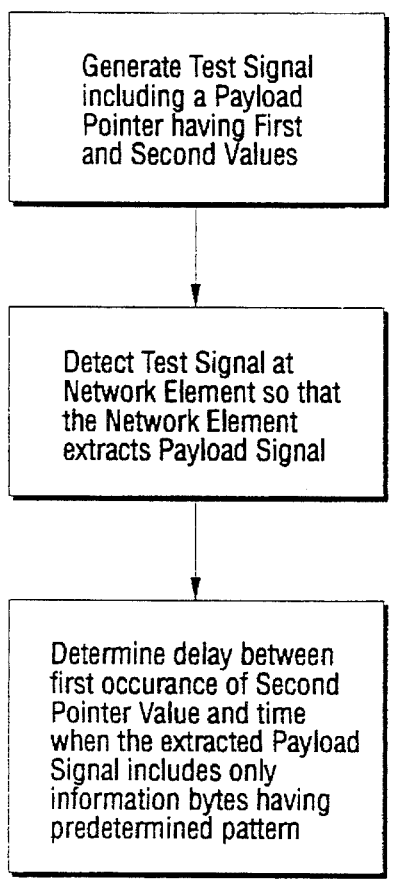
FIG. 16 is a block diagram flow chart illustrating a second method of the present invention.

Referring now to FIG. 16, there is disclosed a method that an be used to measure the time an NE takes to begin using a new pointer value. The method is to send a signal containing one pointer value to the NE, change to a different pointer value (with the NDF set in the first pointer word containing the NDF), and monitor the DSn extracted and dropped by the NE from the affected SPE. Both before and after the pointer change, the DSn information bits contained in the SPE would need to contain a pattern that can be easily distinguished from "garbage" data and AIS when the DSn signal is dropped by the NE (e.g. a "1100" pattern), while the other bytes in the SPE, such as the Path overhead bytes, would need to contain a different pattern (e.g. all zeros). Also, the two pointer values would need to be chosen so that the byte locations within the SONET frame that contain the Path overhead bytes with the new pointer value are locations that contained information bits with the old pointer value. After the NDF and new pointer value are sent, if the NE continues to use the old pointer value for some time after the first occurrence of the new offset, then the (new) overhead bytes will be read as information bits. Since the overhead bytes contain a different pattern than the information bits, those bytes will be apparent in the dropped DSn. The delay between the first occurrence of the new offset and the time when the dropped DSn signal consists of only the pattern contained in the information bytes of the SPE indicates how long the NE delays using the new pointer value. Depending on the test signals and the characteristics of the NE under test, it may be necessary to capture the dropped DSn signal in some form for later analysis. It may be possible to capture the DSn signal directly, or that signal may be looped back to the low speed input of the NE so that it will be mapped and multiplexed into a SONET signal which can be captured by the SONET test set.

FIG. 17 gives an example of a signal that could be used in a VT NDF test. It also shows the DS1 signals that would be generated if the NE met the requirement on using the new pointer value at the first occurrence of the new offset, and the results if it delayed the use for one superframe. Note that in this example the VT pointer is being changed from one value to a larger value. For this type of change, there are no requirements concerning the NE's use of the bytes between the old offset and the new offset, so those bytes (which are shown set to all-ones in the example) may or may not appear in the dropped DS1 signal.

NDF Test Result Interpretation

Most of the SONETADMs that had been analyzed could be used to transport DS3 payloads in STS-1 SPEs and/or DS1 payloads in VT1.5 SPEs. For these types of payloads, it would be logical to perform STS NDF tests for both DS1 and DS3 payloads, and VT NDF tests for DS1 payloads. However, the case of an STS NDF with a DS1 payload is much more complicated than the other two cases, and satisfactory tests and guidelines for interpreting test results have not been developed. When an NE that is dropping DS1 payloads receives an STS NDF, it is possible that those payloads will be interrupted for some time while the NE determines the phase of the VT superframe contained in the shifted STS SPE (using the new H4 byte sequence). Also, it may take the NE one or more superframes to determine if the VT pointers embedded in the shifted STS SPE contain the same offsets as they did before the NDF, and to determine the new offsets if they have changed. Since the criteria in TR 253 does not specifically address these issues, any tests that are developed would primarily be used for information purposes.

In the case of an STS NDF with a DS3 payload, or a VT NDF with a DS1 payload, the primary factor that complicates the analysis of the results is the internal architecture of the NE. If the NE only processes the STS or VT pointer at the time that it terminates the STS or VT SPE, then the dropped DSn payload will directly reflect any delay that the NE has in using the new pointer value, and the interpretation of the results is reasonably straight forward. However, if the NE has one of several other possible architectures, the incoming pointer will not be directly used by the circuit pack that extracts the DSn payload, and that could cause a delay even though the NE may conform with the requirements.

In an NE using one certain architecture, the incoming pointer would be processed on one circuit pack, which would then generate a new pointer value for use in the signal it sends to a lower speed circuit pack. The lower speed circuit pack would then have to process the new pointer (i.e. the internally generated pointer) in order to terminate the SPE and extract the DSn payload. In this architecture, the higher speed circuit pack is simply processing the STS (VT) pointer and then passing the STS (VT), which is equivalent to an ADM that processes the pointers on through STSs (VTs). When such an ADM receives an NDF on a through STS (VT), it should send an NDF downstream in the next available pointer. For both an ADM and a high speed pack that performs pointer processing, the frame rate of the incoming signal is controlled by the far end NE's clock and the frame rate of the outgoing signal is controlled by the local NE's clock, which could result in an offset in both time and frequency between the incoming and outgoing pointers. The offset in time could cause up to a one frame (superframe) delay between the time that the NE receives the incoming NDF and time that the next pointer is available to relay that pointer change information on downstream (i.e. to insert an NDF downstream). If there is an offset in frequency, then the offset in time will change, and that should cause the delays in the use of the incoming NDF tests to vary. Thus, if one NDF test indicates that the NE delays the use of the incoming NDF but that the delay is less than one frame (superframe), then the frequencies of the timing references used to time the test set and the NE should be temporarily offset to determine if the measured delay changes. If the delay does change, then the NE may still conform with the requirements.

While the best mode for carrying out the invention has been described in detail, those familiar with the art to which this invention relates will recognize various alternative designs and embodiments for practicing the invention as defined by the following claims.

What is claimed is:

1. A method for testing a SONET network element having performance monitoring parameters defined for at least one logical layer and capable of performing at least one performance monitoring function, the network element having a normal operating state and a trouble state, the method comprising the steps of:

generating a basic test signal;

modifying the basic test signal to obtain a modified test signal;

detecting the modified test signal at the network element to cause the network element to change from the normal operating state to the trouble state, the network element initiating a set of actions in response to the modified test signal;

monitoring the modified test signal to determine whether the network element is to change back from the trouble state to the normal operating state, wherein the improvement comprises:

the modified test signal includes a first error portion which is followed by a first error-free portion having a first predetermined time period followed by a trouble portion of sufficient length to be detected and cause the network element to change from the normal operating state to the trouble state, said trouble portion being followed by a second error-free portion having a second predetermined time period and followed by a second error portion, wherein the modified test signal tests the at least one logical layer and wherein the set of actions includes inhibiting accumulation of the parameters during a time period in which the network element is in the trouble state and accumulating parameters associated with the first and second error portions of the modified test signal.

2. The method as claimed in claim 1 wherein the set of actions includes a subset of immediate actions and a subset of delayed actions.

3. The method as claimed in claim 1 wherein the first error portion includes a single error and the second error portion includes two errors.

4. The method as claimed in claim 3 wherein the single error of the first error portion is identical to each of the two errors of the second error portion.

5. The method as claimed in claim 1 wherein the first predetermined time period is equal to the second predetermined time period.

6. The method as claimed in claim 5 wherein the first and second predetermined time periods are both equal to one second.

7. A system for testing a SONET network element having performance monitoring parameters defined for at least one logical layer and capable of performing at least one performance monitoring function, the network element having a normal operating state and a trouble state, the system comprising:

means for generating a basic test signal;

means for modifying the basic test signal to obtain a modified test signal;

means for detecting the modified test signal at the network element to cause the network element to change from the normal operating state to the trouble state, the network element initiating a set of actions in response to the modified test signal;

means for monitoring the modified test signal to determine whether the network element is to change back from the trouble state to the normal operating state, wherein the improvement comprises:

the modified test signal includes a first error portion which is followed by a first error-free portion having a first predetermined time period which is followed by a trouble portion of sufficient length to be detected and cause the network element to change from the normal operating state to the trouble state, said trouble portion being followed by a second error-free portion having a second predetermined time period which is followed by a second error portion, wherein the modified test signal tests the at least one logical layer and wherein the set of actions includes inhibiting accumulation of the parameters during a time period in which the network element is in the trouble state and accumulating parameters associated with the first and second error portions of the modified test signal.

8. The system as claimed in claim 7 wherein the set of actions includes a subset of immediate actions and a subset of delayed actions.

9. The system as claimed in claim 7 wherein the first error portion includes a single error and the second error portion includes two errors.

10. The system as claimed in claim 7 wherein the single error of the first error portion is identical to each of the two errors of the second error portion.

11. The system as claimed in claim 7 wherein the first predetermined time period is equal to the second predetermined time period.

12. The system as claimed in claim 11 wherein the first and second predetermined time periods are both equal to one second.

13. A method for testing a SONET network element, the method comprising the steps of:

generating a test signal including a payload pointer initially having a first pointer value and subsequently having a second pointer value different from the first pointer value, the payload pointer indicating the location of the beginning of an incoming synchronous payload envelope (SPE) of the test signal in order to extract a payload signal therefrom, the payload signal including information bytes having a predetermined pattern;

detecting the test signal at the network element so that the network element extracts the payload signal from the SPE and to detect the information bytes having the predetermined pattern; and determining a delay between a first occurrence of the second pointer value and a time when the extracted payload signal includes only the information bytes having the predetermined pattern, wherein the delay indicates how long the network element delays in using the second pointer value.

14. A system for testing a SONET network element, the system comprising:

means for generating a test signal including a payload pointer initially having a first pointer value and subsequently having a second pointer value different from the first pointer value, the payload pointer indicating the location of the beginning of an incoming synchronous payload envelope (SPE) of the test signal in order to extract a payload signal therefrom, the payload signal including information bytes having a predetermined pattern;

means for detecting the test signal at the network element so that the network element extracts the payload signal from the SPE and to detect the information bytes having the predetermined pattern; and means for determining a delay between a first occurrence of the second pointer value and a time when the extracted payload signal includes only the information bytes having the predetermined pattern, wherein the delay indicates how long the network element delays in using the second pointer value.

* * * * *